United States Patent
Nandakumar et al.

(10) Patent No.: US 12,494,425 B2
(45) Date of Patent: Dec. 9, 2025

(54) INTEGRATION SCHEME TO BUILD RESISTOR, CAPACITOR, EFUSE USING SILICON-RICH DIELECTRIC LAYER AS A BASE DIELECTRIC

(71) Applicant: Texas Instruments Incorporated, Dallas, TX (US)

(72) Inventors: Mahalingam Nandakumar, Richardson, TX (US); Yuguo Wang, Plano, TX (US); Haowen Bu, Wylie, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 156 days.

(21) Appl. No.: 17/489,910

(22) Filed: Sep. 30, 2021

(65) Prior Publication Data

US 2022/0375856 A1    Nov. 24, 2022

Related U.S. Application Data

(60) Provisional application No. 63/191,633, filed on May 21, 2021.

(51) Int. Cl.
*H01L 23/522*    (2006.01)
*H01L 21/283*    (2006.01)
(Continued)

(52) U.S. Cl.
CPC ........ *H01L 23/5228* (2013.01); *H01L 21/283* (2013.01); *H01L 21/707* (2013.01);
(Continued)

(58) Field of Classification Search
CPC ............... H01L 23/647; H01L 23/5228; H01L 23/5222; H01L 23/5223; H01L 23/5256;
(Continued)

(56) References Cited

U.S. PATENT DOCUMENTS 8,125,035 B2    2/2012  Nandakumar et al.
8,748,256 B2    6/2014  Zhao et al.
(Continued)

OTHER PUBLICATIONS

Tsung-Li Lu et al., "Characterization of Enhanced Stress Memorization Technique on nMOSFETs by Multiple Strain-Gate Engineering", IEEE Transactions on Electron Devices, vol. 58, No. 4, Apr. 2011, pp. 1023-1028.

*Primary Examiner* — Sue A Purvis
*Assistant Examiner* — Aneta B Cieslewicz
(74) *Attorney, Agent, or Firm* — Andrew R. Ralston; Frank D. Cimino

(57) ABSTRACT

A method and an electronic device that includes an isolation structure having a dielectric material on or in a semiconductor surface layer, and a passive circuit component having a metal silicide structure on a side of the isolation structure, there the metal silicide structure includes a metal silicide portion and a dielectric portion, the dielectric portion of the metal silicide structure including one of silicon nitride, silicon oxide, silicon carbide, silicon carbon nitride, and silicon oxynitride. The method includes forming a dielectric material of the isolation structure on or in the semiconductor surface layer, forming a silicon-rich dielectric layer on a side of the isolation structure, and siliciding the silicon-rich dielectric layer to form the metal silicide structure on the side of the isolation structure.

17 Claims, 26 Drawing Sheets

(51) Int. Cl.
*H01L 21/70* (2006.01)
*H01L 23/525* (2006.01)
*H10D 1/47* (2025.01)
*H10D 1/68* (2025.01)
*H10D 84/80* (2025.01)

(52) U.S. Cl.
CPC ...... *H01L 23/5223* (2013.01); *H01L 23/5256* (2013.01); *H10D 1/474* (2025.01); *H10D 84/811* (2025.01); *H10D 1/692* (2025.01)

(58) Field of Classification Search
CPC ......... H01L 28/24; H01L 28/40; H01L 28/60; H01L 27/0629; H01L 21/707; H01L 21/283–2885; H10D 84/811–817; H10D 1/474; H10D 1/692–711
See application file for complete search history.

(56) References Cited

U.S. PATENT DOCUMENTS

2008/0305601 A1* 12/2008 Chen .................. H01L 29/7843
257/E21.324
2010/0012937 A1* 1/2010 Lee .................. H01L 27/14687
438/59

\* cited by examiner

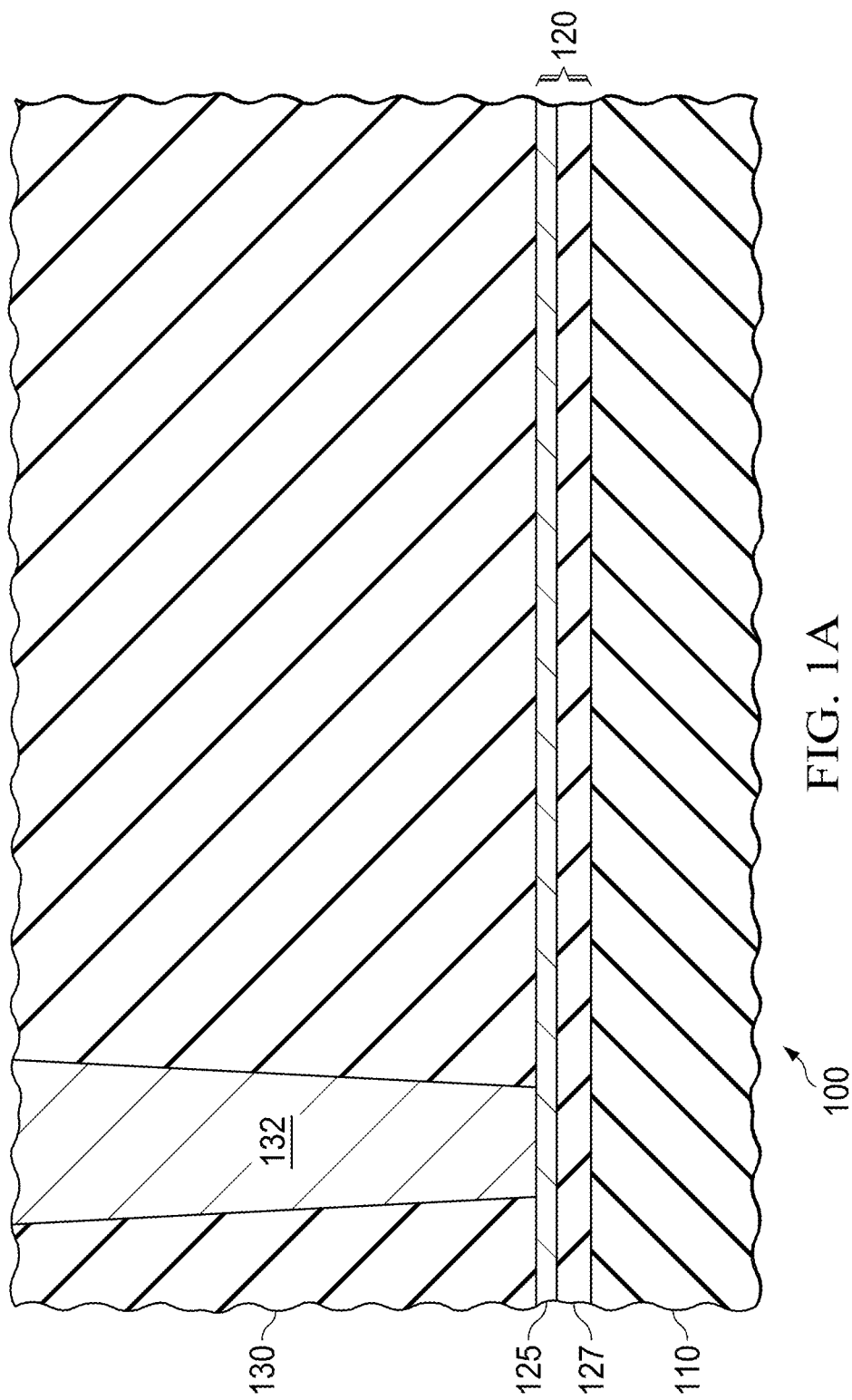

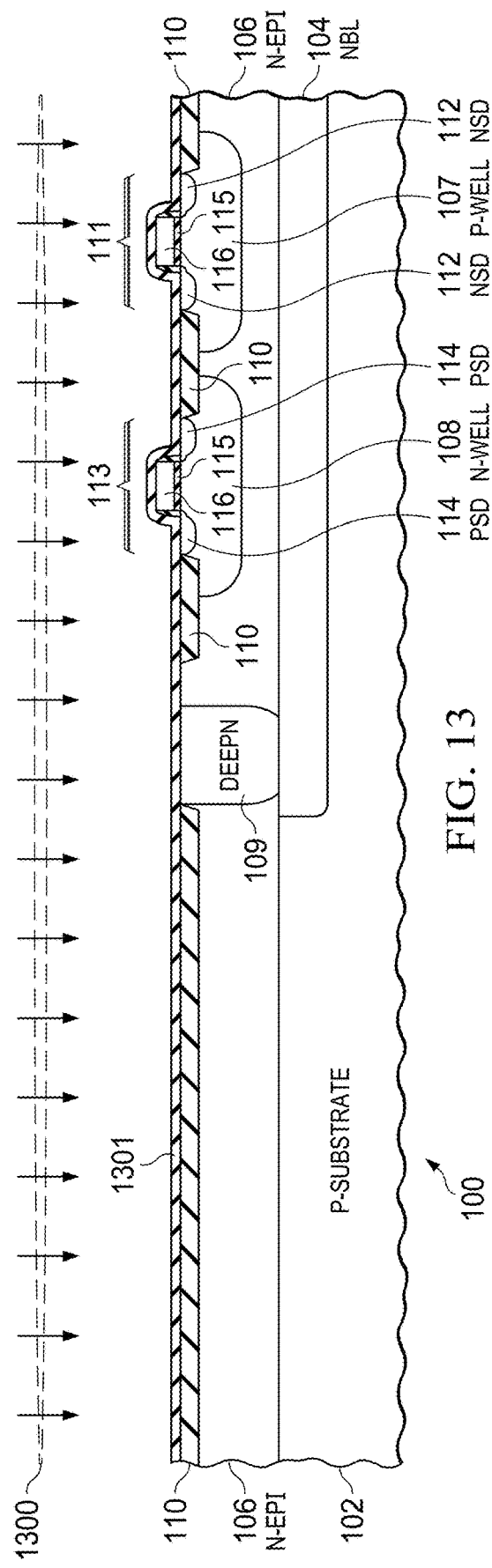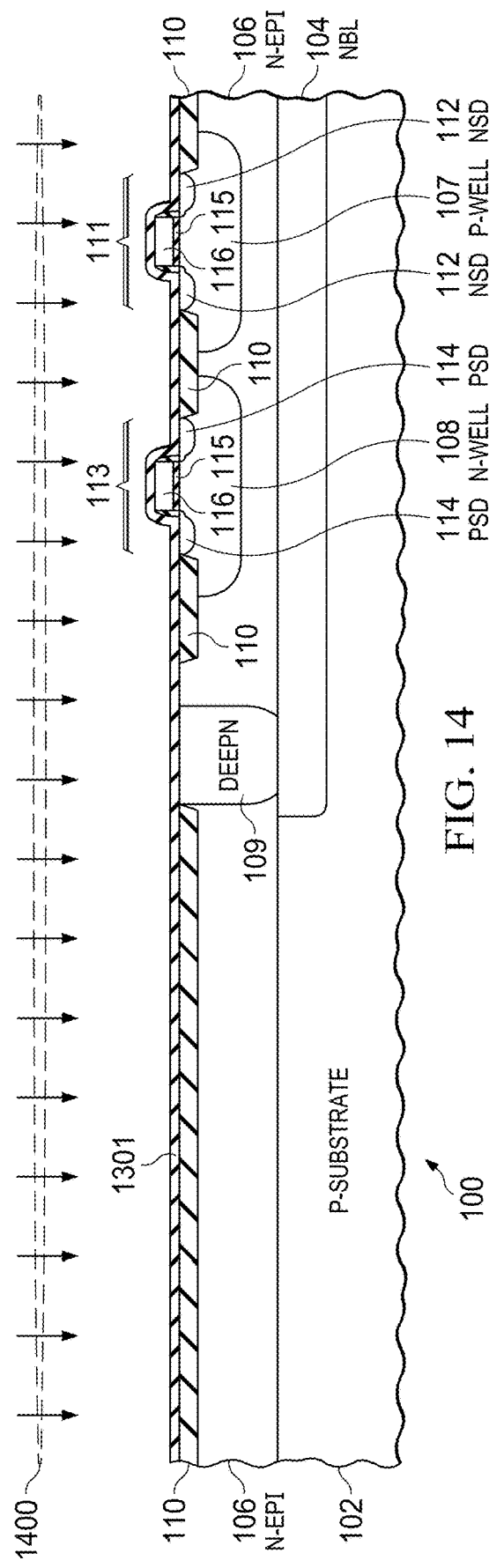

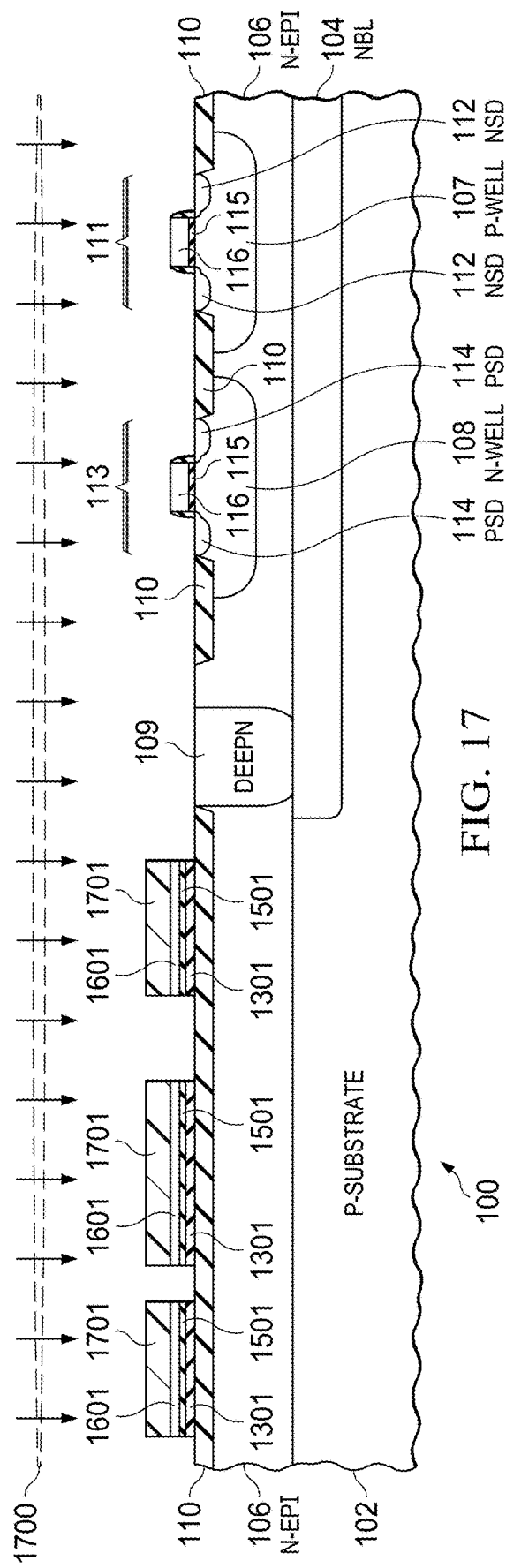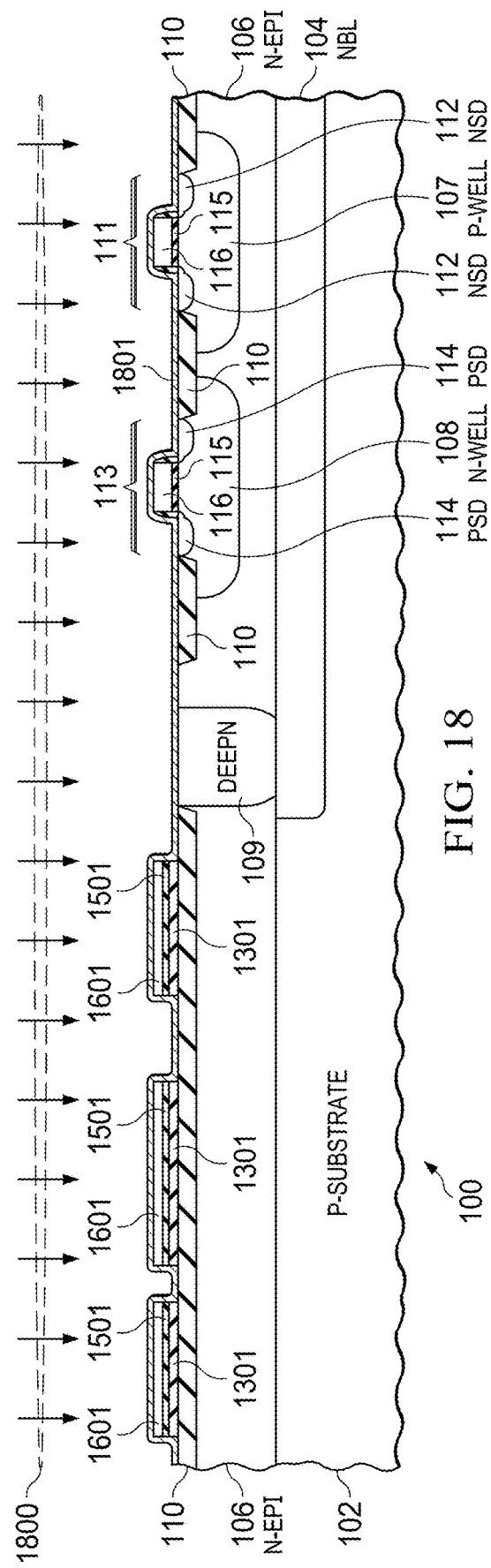

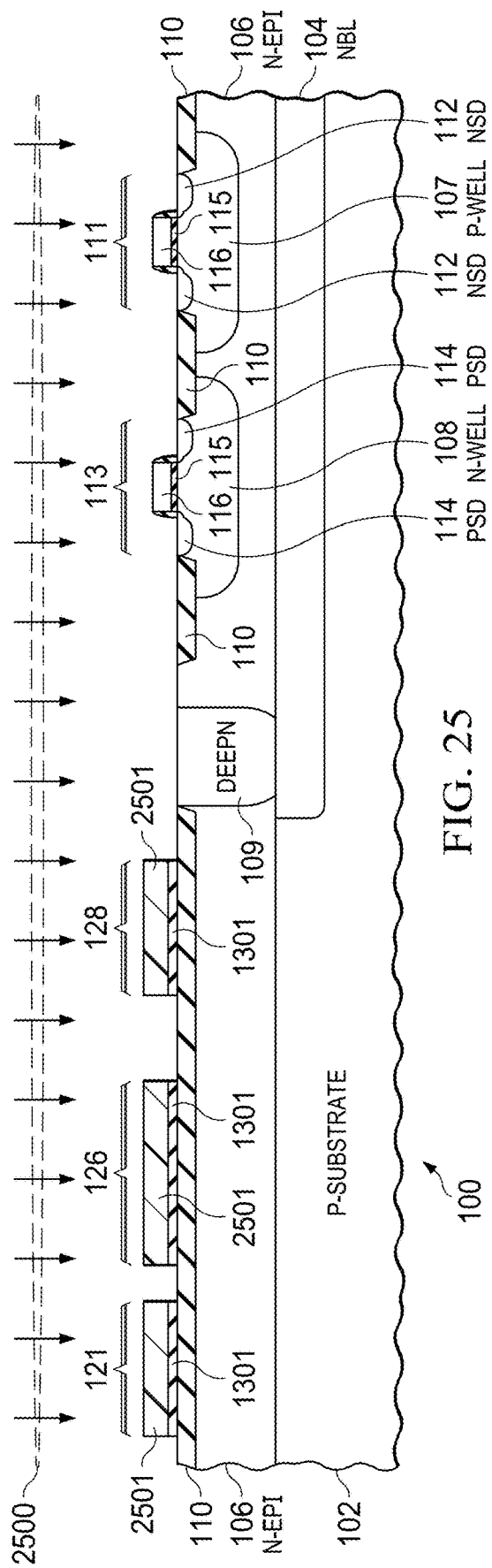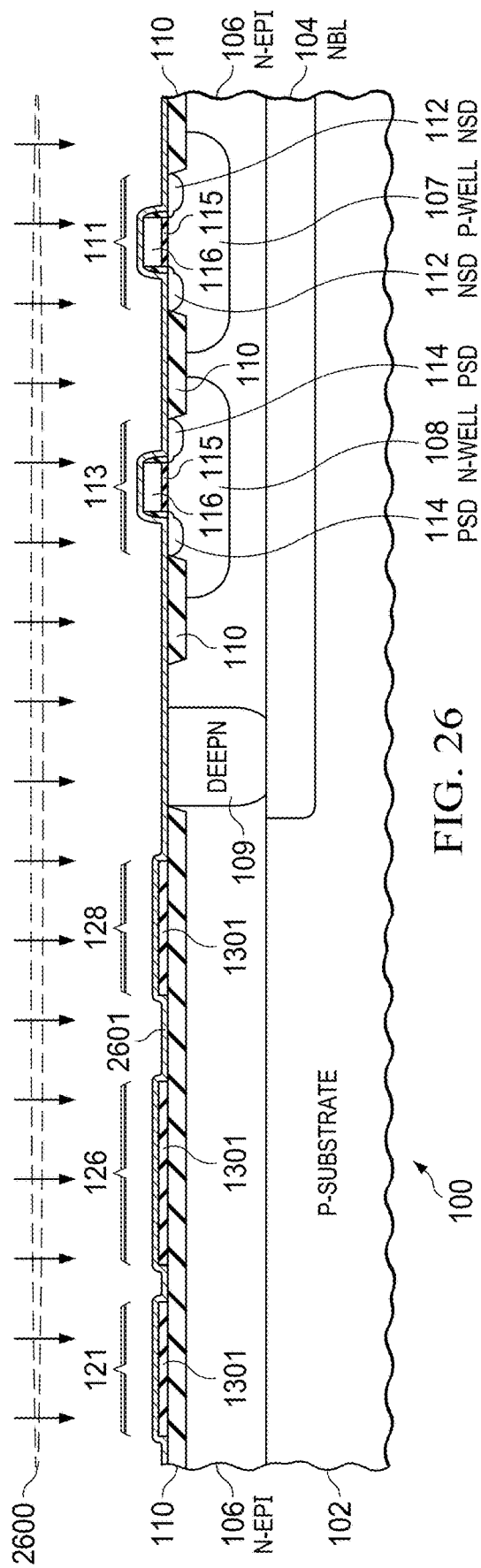

INTEGRATION SCHEME TO BUILD RESISTOR, CAPACITOR, EFUSE USING SILICON-RICH DIELECTRIC LAYER AS A BASE DIELECTRIC

CROSS-REFERENCE TO RELATED APPLICATION

This application claims priority to and benefit of U.S. Provisional Patent Application Ser. No. 63/191,633, filed on May 21, 2021, and titled "Novel Integration scheme to build capacitor, star, efuse using SMT layer as base dielectric", the contents of which are hereby fully incorporated by reference.

BACKGROUND

Integrated circuits and other packaged electronic devices may include chip scale passive circuit components in a semiconductor die. Analog circuits may include integrated high density, high voltage capacitors as well as fuses and resistors. Zero temperature coefficient resistors can be used to provide a stable resistance in applications where the electronic device may be operated across a wide temperature range. Polysilicon resistors can be doped with impurities to set the desired resistance for a given component size. Polysilicon resistor fabrication can in some cases use existing source-drain implants for low cost and dedicated masks can be used for implanting zero temperature coefficient resistors. However, polysilicon resistors are sensitive to stress, and the component resistance can change in response to stresses induced during device manufacturing and during use due to mobility change with stress. Moreover, boron doped polysilicon resistors are subject to drift caused by hydrogen passivation in grain boundaries. In addition, it is difficult to control higher resistance values for polysilicon resistors due to reduced linearity at lower doping levels and increased variability for narrower polysilicon line widths during manufacturing. The resistance value of polysilicon resistors doped with boron drifts when baked at high temperatures for long periods of time, and the drift is worse for resistors doped with both boron and phosphorous. In addition to passive component parameter drifts and variability, introducing additional steps to fabrication processes in order to create fuses, resistors and capacitors during wafer processing increases product cost and manufacturing complexity.

SUMMARY

In one aspect, an electronic device includes a semiconductor surface layer, and insulation structure, and a passive circuit component. The isolation structure has a dielectric material on or in the semiconductor surface layer. The passive circuit component has a metal silicide structure on a side of the isolation structure, and the metal silicide structure includes a metal silicide portion and a dielectric portion, the dielectric portion of the metal silicide structure including one of silicon nitride, silicon oxide, silicon carbide, silicon carbon nitride, and silicon oxynitride.

In another aspect, a method of forming an electronic device includes forming a dielectric material of an isolation structure on or in a semiconductor surface layer, forming a silicon-rich dielectric layer on a side of the isolation structure, and siliciding the silicon-rich dielectric layer to form a metal silicide structure of a passive circuit component on the side of the isolation structure.

In a further aspect, a method of forming a passive circuit component includes forming a silicon-rich dielectric layer on a side of a dielectric material of an isolation structure and siliciding the silicon-rich dielectric layer to form a metal silicide structure of a passive circuit component on the side of the isolation structure. The method also includes forming a dielectric layer on the semiconductor surface layer, the isolation structure, and the metal silicide structure, as well as forming a conductive contact through the dielectric layer to contact the metal silicide structure and forming a metallization structure on the dielectric layer to couple the metal silicide structure to a circuit.

BRIEF DESCRIPTION OF THE DRAWINGS

FIG. 1A is a partial sectional side elevation view of a portion of a metal silicide structure of a passive circuit component in the electronic device of FIG. 1.

FIGS. 3-23 are partial sectional side elevation views of the electronic device of FIG. 1 undergoing fabrication processing according to the method of FIG. 2.

FIGS. 25-28 are partial sectional side elevation views of the electronic device undergoing alternative processing sequence in another implementation of the method of FIG. 2.

DETAILED DESCRIPTION

Figure 1:
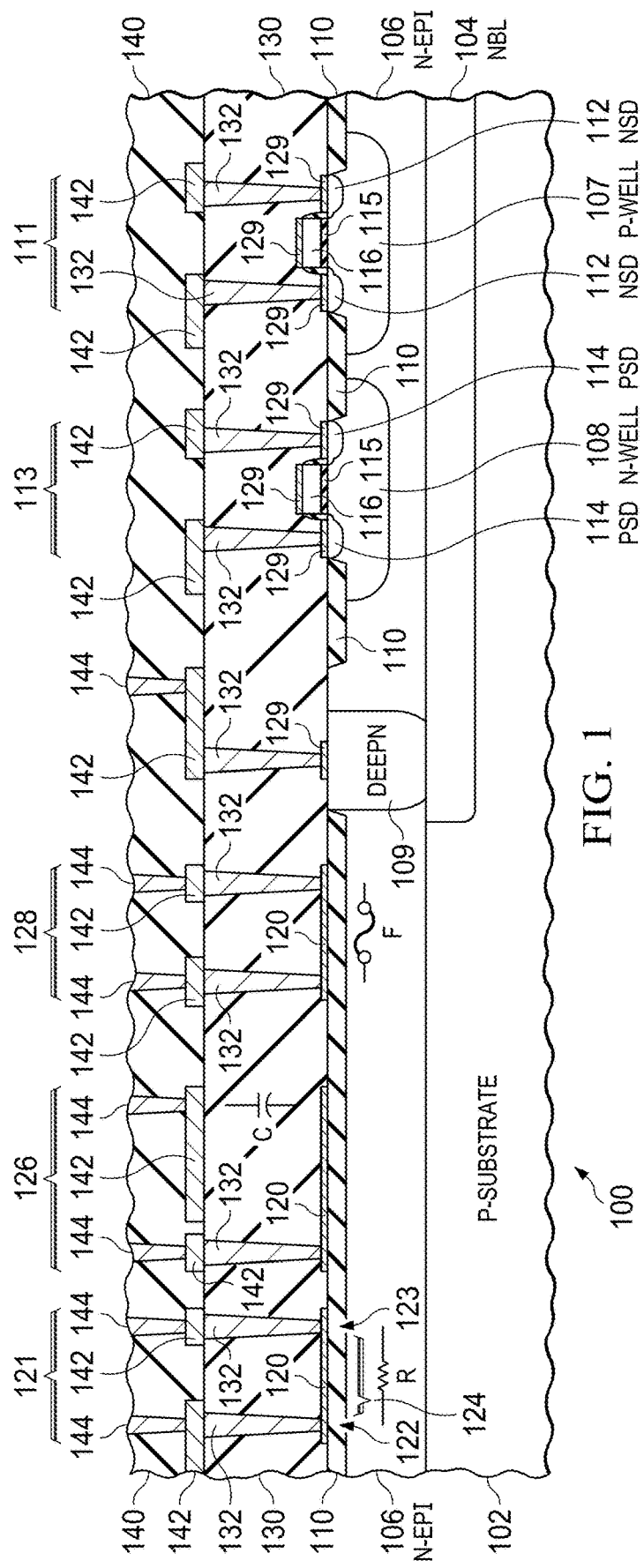
FIG. 1 is a partial sectional side elevation view of an electronic device with metal silicide passive circuit components on an isolation structure.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

FIG. 1 shows an electronic device 100 that includes metal silicide structure 120 of passive circuit components on an isolation structure. The electronic device 100 in one example is an integrated circuit product, only a portion of which is shown in FIG. 1. The electronic device 100 includes electronic components, such as transistors, resistors, capacitors (not shown) fabricated on or in a semiconductor structure of a starting wafer, which is subsequently separated or singulated into individual semiconductor dies that are separately packaged to produce integrated circuit products. As illustrated in FIG. 1, the electronic device 100 includes a semiconductor structure having a semiconductor substrate 102, a buried layer 104 in a portion of the semiconductor substrate 102, a semiconductor surface layer 106 with an p-doped well or region 107 (e.g., labeled "P-WELL"), an n-doped well or region 108 (e.g., labeled "N-WELL"), and an upper or top side and a deep doped region 109, and shallow trench isolation (STI) structures 110 that extend into corresponding portions of the top side of the semiconductor surface layer 106. In one example, the shallow trench isolation 110 structures are or include a dielectric material such as silicon dioxide ($SiO_2$) on or in the semiconductor surface layer 106, for example, $SiO_2$ deposited into previously formed trenches that extend into the semiconductor surface layer 106 during fabrication of the electronic device 100.

The semiconductor substrate 102 in one example is a silicon or silicon on insulator (SOI) structure that includes majority carrier dopants of a first conductivity type. The buried layer 104 extends in a portion of the semiconductor substrate 102 and includes majority carrier dopants of a second conductivity type. In the illustrated implementation, the first conductivity type is P, the second conductivity type is N, the semiconductor substrate 102 is labeled "P-SUBSTRATE", and the buried layer 104 is an N-type buried layer labeled "NBL" in the drawings. In another implementation (not shown), the first conductivity type is N, and the second conductivity type is P.

The semiconductor surface layer 106 in the illustrated example is or includes epitaxial silicon. In one example, the epitaxial silicon has majority carrier dopants of the second conductivity type and is labeled "N-EPI" in the drawings. Alternatively, semiconductor surface layer 106 may have majority carrier dopants of the first conductivity type in which case PWELL 107 can, in some cases, be omitted. The deep doped region 109 includes majority carrier dopants of the second conductivity type and is labeled "DEEPN" in the drawings. The deep doped region 108 extends from the semiconductor surface layer 106 to the buried layer 104.

The electronic device 100 includes an optional n-channel field effect transistor 111 (e.g., FET or NMOS) with source/drain implanted portions 112 (e.g., a first implanted region) of the semiconductor surface layer 106 along the top side in the p-doped well 107, which include majority carrier dopants of the second conductivity type (e.g., labeled "NSD"). The electronic device 100 also includes an optional p-channel FET 113 having source/drain implanted portions 114 along the top side of the semiconductor surface layer 106 in the n-doped well 108, which include majority carrier dopants of the first conductivity type (e.g., labeled "PSD"). The individual transistors 111 and 113 each have gate dielectric (e.g., gate oxide) layer 115 formed over a channel region laterally between the respective source/drain implanted portions 112 and 114, as well as a doped polysilicon gate electrode 116 on the gate dielectric 115.

The electronic device 100 includes metal silicide structures 120 over an upper side of the isolation structure 110, as well as metal silicide structures 129 that extend over and provide electrical connection to the source/drain implanted portions 112, 114 and the gate electrodes 116. In one example, the metal silicide structures 120 are on the upper side of the isolation structure 110.

The electronic device 100 includes one or more types of passive circuit components that have a respective one of the metal silicide structures 120. The passive circuit components may include resistors, capacitors, and/or fuses. A resistor 121 in this example has a first resistor terminal 122, a second resistor terminal 123 and a resistor body 124. The first and second resistor terminals 122 and 123 are located on laterally opposite sides of the resistor body 124. The electronic device 100 may alternatively or additionally include a capacitor 126 or a fuse 128 as shown in FIG. 1. FIG. 1 also includes schematic symbol representations of the resistor 121 with a resistance R, the capacitor 126 with a capacitance C, and the fuse 128 (e.g., also labeled "F").

Referring also to FIG. 1A, FIG. 1A shows a portion of a metal silicide structure 120 of a passive circuit component in the electronic device of FIG. 1. The metal silicide structure 120 includes a metal silicide portion 125 and a dielectric portion 127. The metal silicide portion 125 in one example is the product of silicidation of a silicon-rich dielectric material (e.g., silicon nitride, silicon oxide, silicon carbide, silicon carbon nitride, or silicon oxynitride) with a silicidable metal (e.g., titanium, cobalt, tungsten, nickel-platinum, or nickel). The dielectric portion 127 of the metal silicide structure 120 in this example is remaining dielectric after the silicidable metal atoms react with the silicon-rich dielectric. The physical location of the portions 125 and 127 can differ depending on the silicon content in the starting dielectric and the specific silicidable metal used in the silicidation process. For example, the dielectric portion 127 can be underneath the metal silicide portion 125, or clusters of dielectric portions 127 can be intermixed with clusters of metal silicide portions 125, or clusters of one portion can be intermixed in an otherwise continuous layer of the other portion.

The metal silicide structure 120 in one example includes a generally uniform metal silicide portion 125 over (e.g., on) a generally uniform dielectric portion 127 as shown in FIG. 1A. In another example, the metal silicide structure 120 includes multiple metal silicide portions 125 and multiple dielectric portions 127 with clusters of the dielectric portions 127 intermixed with clusters of the metal silicide portions 125. The dielectric portion or portions 127 in one example of the metal silicide structure 120 includes one of silicon nitride, silicon oxide, silicon carbide, silicon carbon nitride, and silicon oxynitride.

In this or another example, the metal silicide portion or portions 125 has a silicon to nitrogen atomic ratio of greater than 10 as measured by an elemental analysis technique, such as X-ray photoelectron spectroscopy (XPS) or Rutherford backscattering spectrometry (RBS), indicating that any remaining nitrogen atoms are just impurities in the silicide. In these or another example, the metal silicide portion or portions 125 has a silicon to oxygen atomic ratio of greater than 20 as measured by an elemental analysis technique, indicating that any remaining oxygen atoms are just impurities in the silicide. In these or another example, the metal silicide portion or portions 125 has a silicon to carbon atomic ratio of greater than 20 as measured by an elemental analysis technique, indicating that any remaining carbon atoms are just impurities in the silicide.

In these or another example, the dielectric portion or portions 127 has a silicon to nitrogen atomic ratio of approximately 0.75 to 2.0 as measured by an elemental analysis technique. In these or another example, the dielectric portion or portions 127 has a silicon to oxygen atomic ratio of approximately 0.5 to 1.5 as measured by an elemental analysis technique. In these or another example, the dielectric portion or portions 127 has a silicon to carbon atomic ratio of approximately 1.0 to 3.0 as measured by an elemental analysis technique.

The electronic device 100 includes a multilevel metallization structure, only a portion of which is shown in the drawings. A first dielectric layer 130 (e.g., a pre-metal dielectric layer labeled "PMD" in the drawings) extends on or over the shallow trench isolation structure 110, the transistors 111 and 113, and portions of the top side of the semiconductor surface layer 106. In one example, the first dielectric layer is or includes $SiO_2$. The dielectric layer 130 includes conductive contacts 132 (e.g., tungsten) that extend through the dielectric layer 130 to form electrical contacts to the metal silicide structure 129 of the respective implanted regions 112, 114, and gate contacts 116 of the semiconductor surface layer 106. The dielectric layer 130 also includes conductive contact 132 that form electrical contact to the passive components 121, 126 and 128. The multilevel metallization structure also includes a second dielectric layer 140 (e.g., $SiO_2$), referred to herein as an interlayer or interlevel dielectric (ILD) layer (e.g., labeled "ILD"). The second dielectric layer 140 includes conductive routing structures 142, such as traces or lines. In one example, the conductive routing structures 142 are or include copper or aluminum or aluminum or other conductive metal. The second dielectric layer 140 includes conductive vias 144 that are or include copper or aluminum or other conductive metal. In one example, the electronic device 100 includes one or more further metallization layers or levels (not shown) above the second dielectric layer 140.

A first contact 132 of the PMD dielectric layer 130 contacts the first resistor terminal 122 and a second contact 132 of the PMD dielectric layer 130 contacts the second resistor terminal 123. The electrical connections to the first and second resistor terminals 122 and 123 couple the resistor terminals to a circuit of the electronic device 100 by interconnections of the multilevel metallization structure. One or more of the passive component terminals can be connected to externally exposed pads or terminals of a finished packaged electronic device through signal routing of the multilevel metallization structure. The resistor 121 is a continuous metal silicide structure having the resistor terminals 122 and 123 proximate the laterally opposite sides of the resistor body 124 to provide a resistance R between the associated contacts 132.

The metal silicide structure 120 of the capacitor 126 forms a conductive first capacitor plate (e.g., a bottom plate in the orientation shown in FIG. 1), and a patterned conductive feature 142 of the ILD dielectric layer 140 forms a conductive second (e.g., upper) capacitor plate. A portion of the PMD dielectric layer 130 extends between the first and second capacitor plates to form a capacitor structure with a capacitance C. A first contact 132 of the PMD dielectric layer 130 contacts the lower first capacitor plate and a conductive via 144 of the ILD dielectric layer 140 contacts the upper second capacitor plate. The fuse 128 has a fuse body as well as first and second fuse terminals located on opposite sides of the fuse body. A first contact 132 of the PMD dielectric layer 130 contacts the first fuse terminal and a second contact 132 of the PMD dielectric layer 130 contacts the second fuse terminal and the fuse terminals are coupled to a circuit that facilitates selective opening by current flow through the fuse body to electrically disconnect the first and second fuse terminals from one another, for example, to program a function or circuit of the electronic device.

The metal silicide structure 120 of the resistor 121, the capacitor 126 and the fuse 128 provide benefits and advantages compared to polysilicon resistors and other integrated capacitor and fuse structures. For example, the metal silicide structure 120 provides a high sheet resistance and low stress coefficient of resistance compared to polysilicon resistors. In one example, a sheet resistance of silicided silicon nitride film has a temperature coefficient of −876 ppm/degree C. at a sheet resistance of approximately 3000 ohms/square, which is approximately 250 ppm higher than the temperature coefficient of an implanted polysilicon resistor and facilitate use as a stress independent temperature sensors (e.g., a negative temperature coefficient or NTC sensor element) or as an electronic fuse (efuse) integrated into the packaged electronic device 100. In certain examples the metal silicide structure 120 provides reduced stress impact on the performance of the passive circuit components 121, 126 and/or 128 without increasing cost or manufacturing complexity. As discussed further below, one example uses a stress memorization technique (SMT) layer in formation of the metal silicide structures 120, which is also used for stress memorization during fabrication of the transistors 111 and 113, and the metal silicide structures 120 are patterned using existing masks, such as silicide block mask used for patterning polysilicon resistors. The provision of the metal silicide structures 120 in the electronic device 100 is done in one implementation with little or no significant modification to existing processes and/or with few additional steps and low added cost because there are no new masking steps. Integration of zero temperature coefficient resistors, capacitors, interconnect layers and/or efuses with better stress performance without additional masking steps is beneficial in terms of value and functionality.

Referring also to FIGS. 2-24, FIG. 2 shows a method 200 for making an electronic device and for making a passive circuit component in an electronic device. While the figures include a resistor, a capacitor, and a fuse, the electronic device may include only one type, any two types or all three types of passive components. FIGS. 3-23 show the electronic device 100 of FIG. 1 at various stages of fabrication according to the method 200, and 24 shows a perspective view of the packaged electronic device 100. The method 200 begins in FIG. 2 with a starting wafer, such as a silicon wafer 102 or a silicon on insulator wafer that includes majority carrier dopants of a first conductivity type (e.g., P in the illustrated example).

Figure 3:
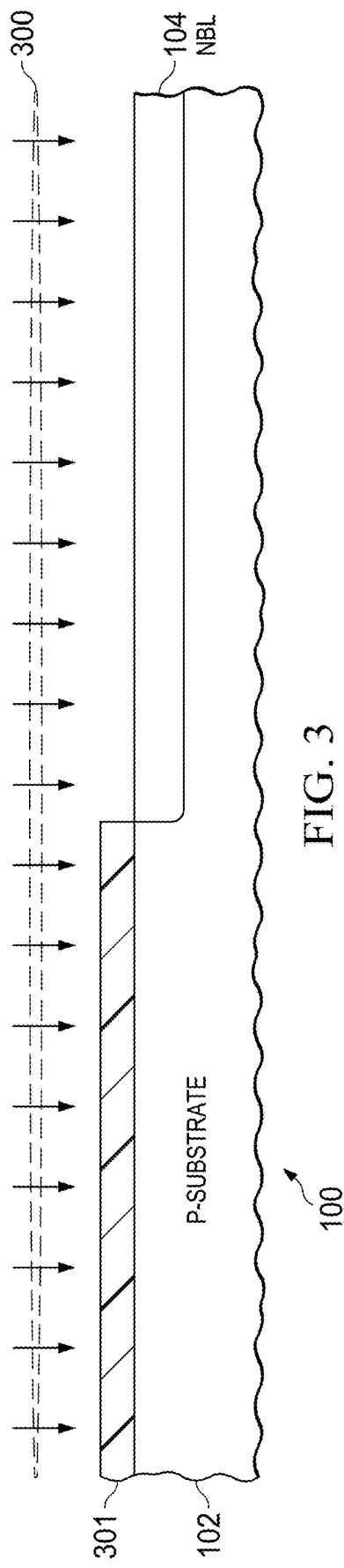

The method 200 includes forming a buried layer at 202. FIG. 3 shows one example, in which an implantation process 300 is performed using an implant mask 301. The implantation process 300 implants dopants of the second conductivity type (e.g., N in the illustrated example) into an exposed portion of the top side of the semiconductor substrate 102 to form the buried layer 104 in a portion of the semiconductor substrate 102. The implant mask 301 is then removed. In another implementation, a blanket implantation is performed at 202 without an implant mask.

Figure 2:
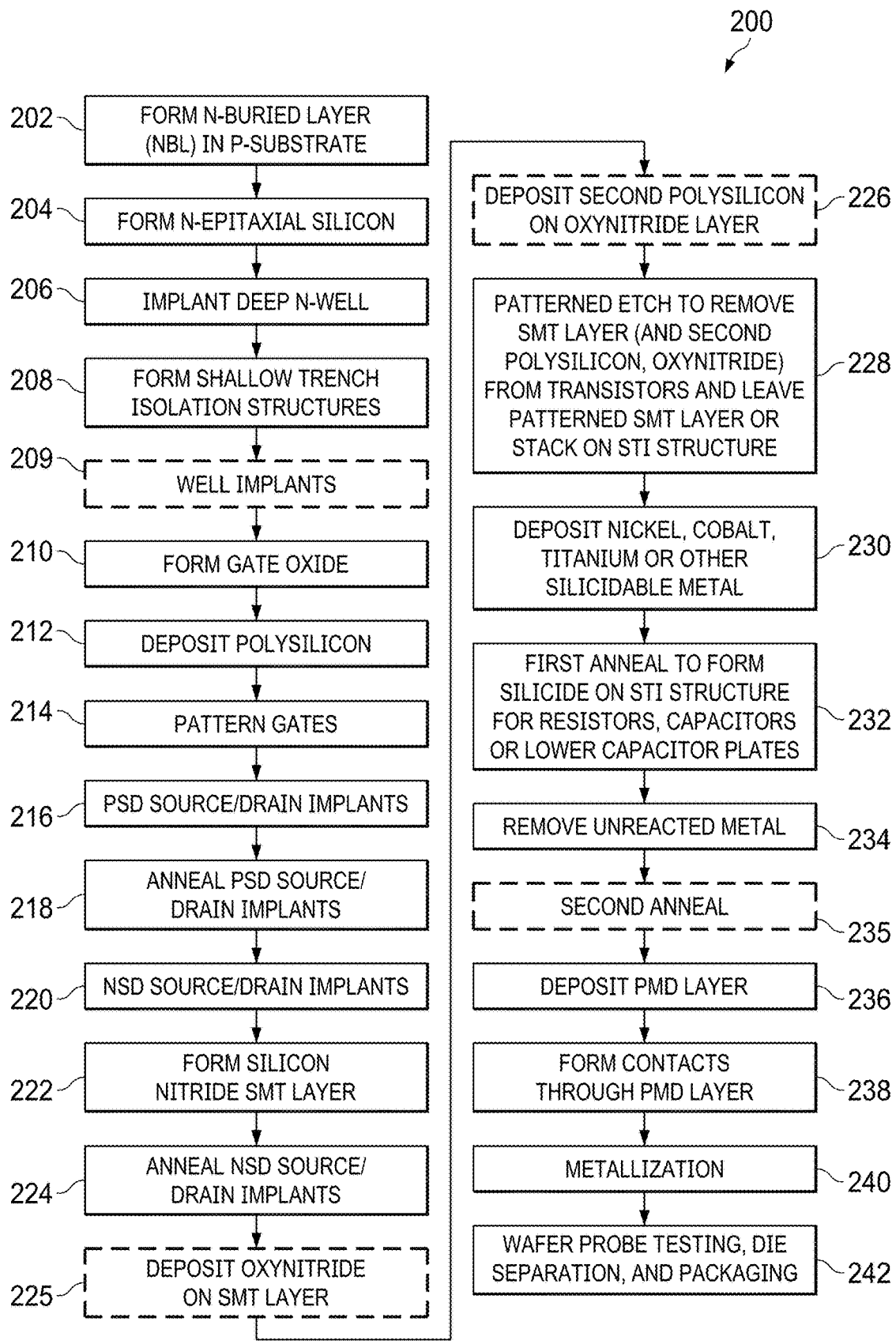
FIG. 2 is a flow diagram of a method of fabricating an electronic device.
Figure 4:
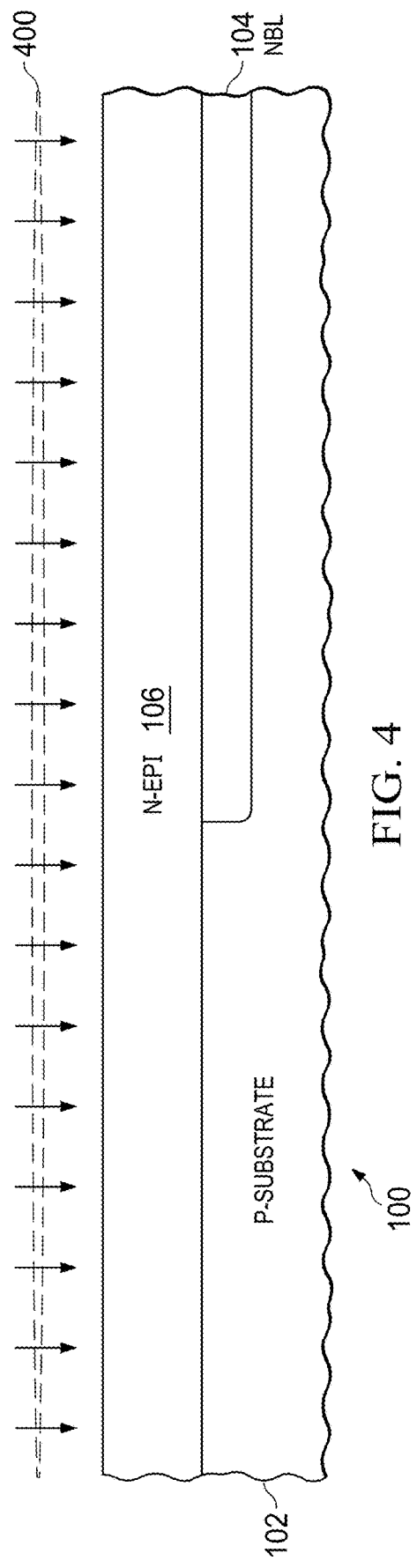

At 204 in FIG. 2, the method 200 also includes forming a semiconductor surface layer on the semiconductor substrate. FIG. 4 shows one example, in which an epitaxial growth process 400 is performed with in-situ N-type dopants that grows the N-doped epitaxial silicon semiconductor surface layer 106 on the top side of the semiconductor substrate 102. The semiconductor surface layer 106 has a top side as previously described.

Figure 5:
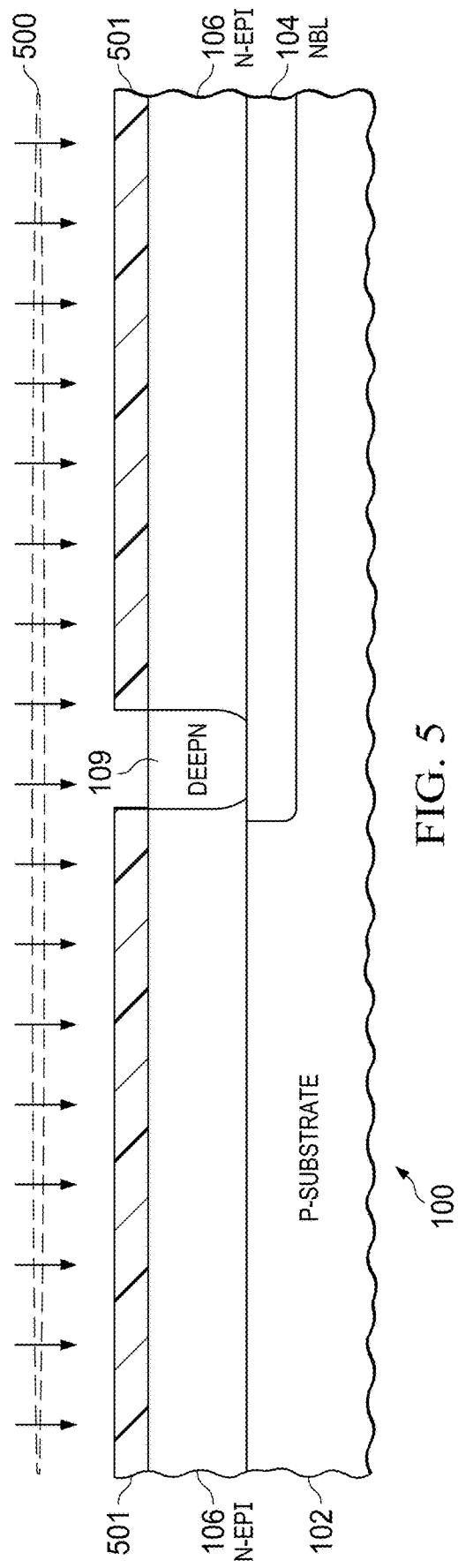

At 206 in FIG. 2, the method 200 also includes forming a deep doped region that includes majority carrier dopants of the second conductivity type. FIG. 5 shows one example, in which an implantation process 500 is performed using an implant mask 501. The implantation process 500 implants dopants of the second conductivity type (e.g., N in the illustrated example) into an exposed portion of the top side of the semiconductor surface layer 106 to form the deep doped region 109 that extends from the top side of the semiconductor surface layer 106 to the buried layer 104. The implant mask 501 is then removed.

Figure 6:
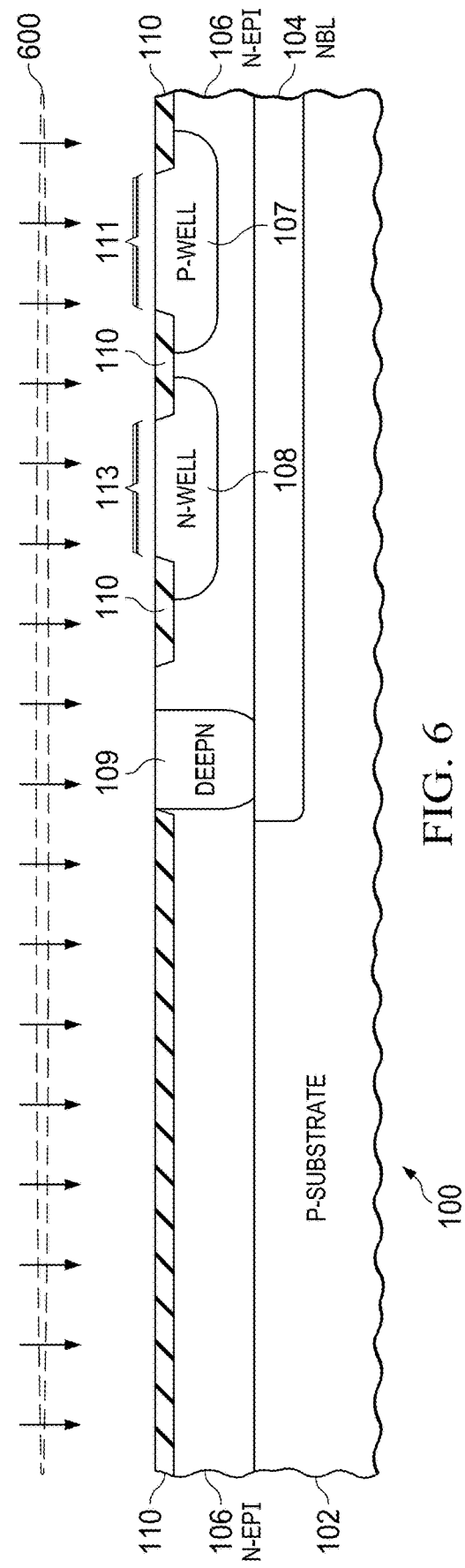

At 208 in FIG. 2, the method 200 also includes STI processing to form the shallow trench isolation structures 110. FIG. 6 shows one example, in which an STI process 600 is performed that includes forming a trench or trenches in the semiconductor surface layer 106, for example, using an etch process (e.g., dry etching, such as reactive ion etch (RIE) processing) and an etch mask (e.g., an oxide, nitride, patterned resist stack not shown), thermal oxidation to oxidize sidewalls of the trench, and forming (e.g., depositing) the dielectric material of the isolation structures 110 in the trenches, for example, by chemical vapor deposition (CVD) of an oxide material in the trenches. The STI processing 600 in one implementation also includes planarization, such as chemical mechanical polishing (CMP) to planarize the structure after trench-fill deposition, and removal of the protective nitride.

The method 200 in one example also includes one or more well implants at 209, for example, implanting boron or other p-type dopants to form the p-doped well or region 107 using a first implant mask (not shown), and implanting phosphorus or other n-type dopants with a second implant mask to form the n-doped well or region 108 shown in FIG. 6. The p-doped region 107 is formed on one example by ion implanting a first set of p-type dopants, such as boron, for example in the form of $BF_2$, and/or gallium and/or indium, for example, at doses from 1E11 to 1E14 atoms/cm$^2$, into a region defined for the n-channel FET 111 while the implant mask covers the regions defined for the p-channel FET 113. In one example, the p-doped region 107 extends from the top side or surface of the semiconductor surface layer 106 to a depth of 50 nm to 500 nm. The ion implantation process to form the p-doped region 107 in one example further includes implanting additional p-type dopants at shallower depths, for example, to improve the n-channel transistor performance, such as threshold adjustment, leakage current reduction and suppression of parasitic bipolar operation, etc.

In one example, the n-doped region 108 is formed at 209 by ion implanting a first set of n-type dopants, such as phosphorus, arsenic and/or antimony, for example at doses from 1E11 to 1E14 atoms/cm$^2$, into a region defined for the p-channel transistor 113 using an implant mask (not shown) that exposes the region 108 and covers the other regions of the semiconductor surface layer 106. The n-doped region 108 in one example extends from the top side or surface of the semiconductor surface layer 106 to a depth of 50 nm to 500 nm. The ion implantation process to form the n-doped region 108 in one example also includes implanting n-type dopants at shallower depths for purposes of improving transistor performance, such as threshold adjustment, leakage current reduction and suppression of parasitic bipolar operation.

Figure 7:
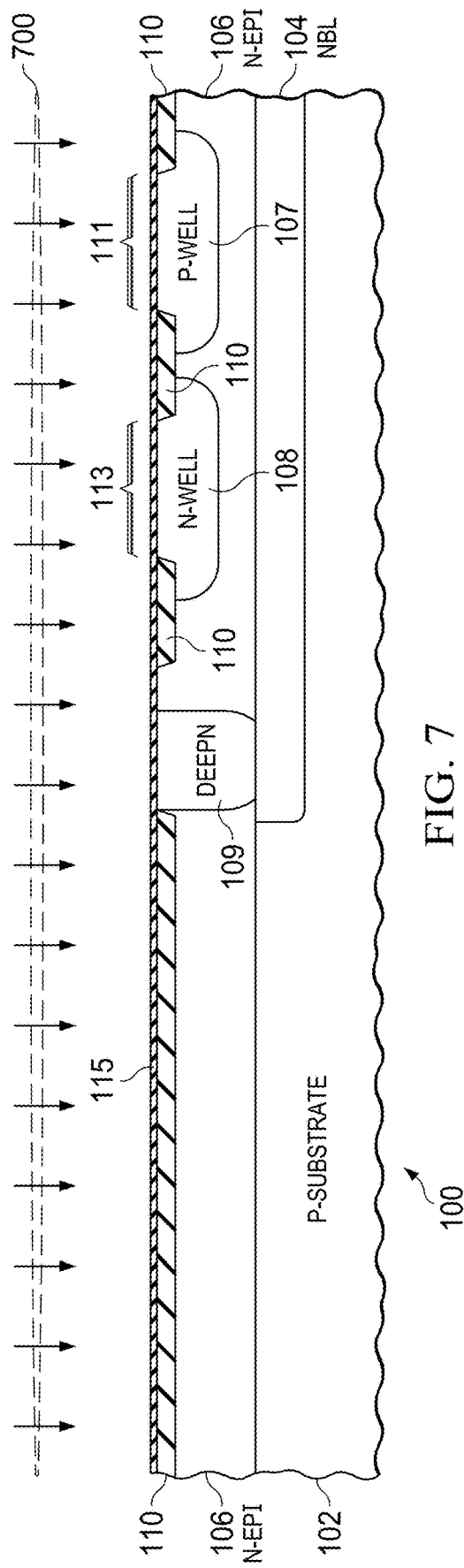

The method 200 continues with transistor fabrication including gate oxide formation at 210 in FIG. 2. FIG. 7 shows one example, in which a blanket deposition process 700 is performed that deposits the gate dielectric (e.g., gate oxide) layer 115 on the channel regions laterally between the respective source/drain implanted portions 112 and 114, as well as on the STI isolation structures 110. In one example, the gate dielectric layer 115 is or includes silicon dioxide, nitrogen doped silicon dioxide, silicon oxy-nitride, hafnium oxide, layers of silicon dioxide and silicon nitride, or other insulating material, with a thickness of 1 to 3 nm on the top side or surface of the channel regions laterally between the respective source/drain implanted portions 112 and 114, as well as on the STI isolation structures 110.

Figure 8:
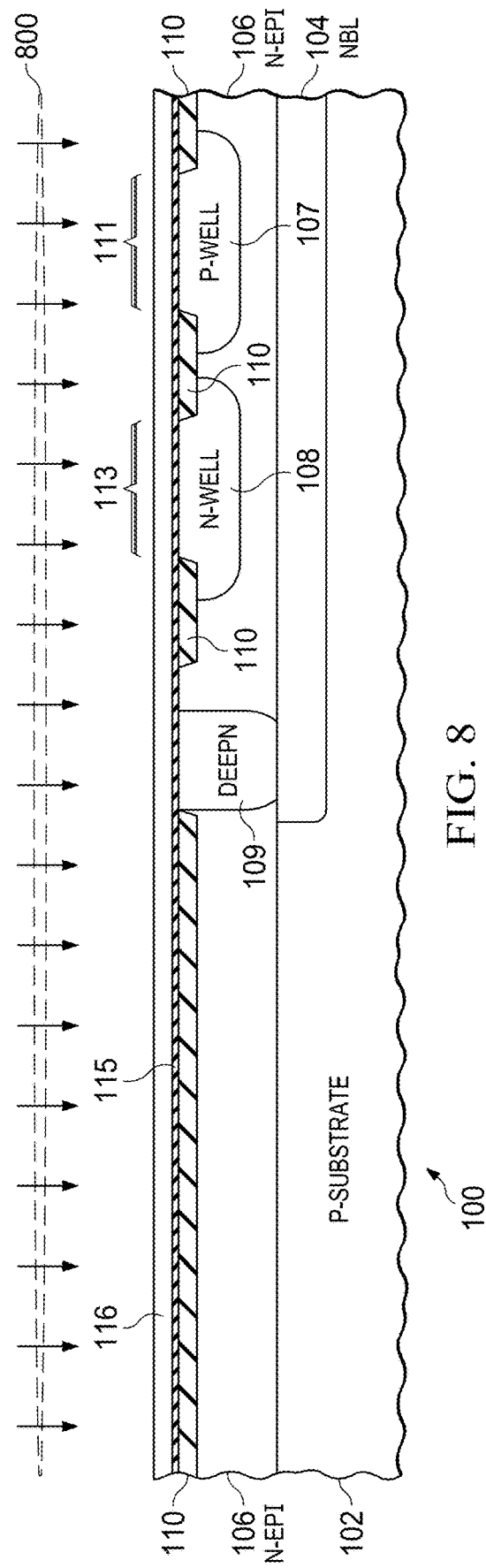
Figure 9:
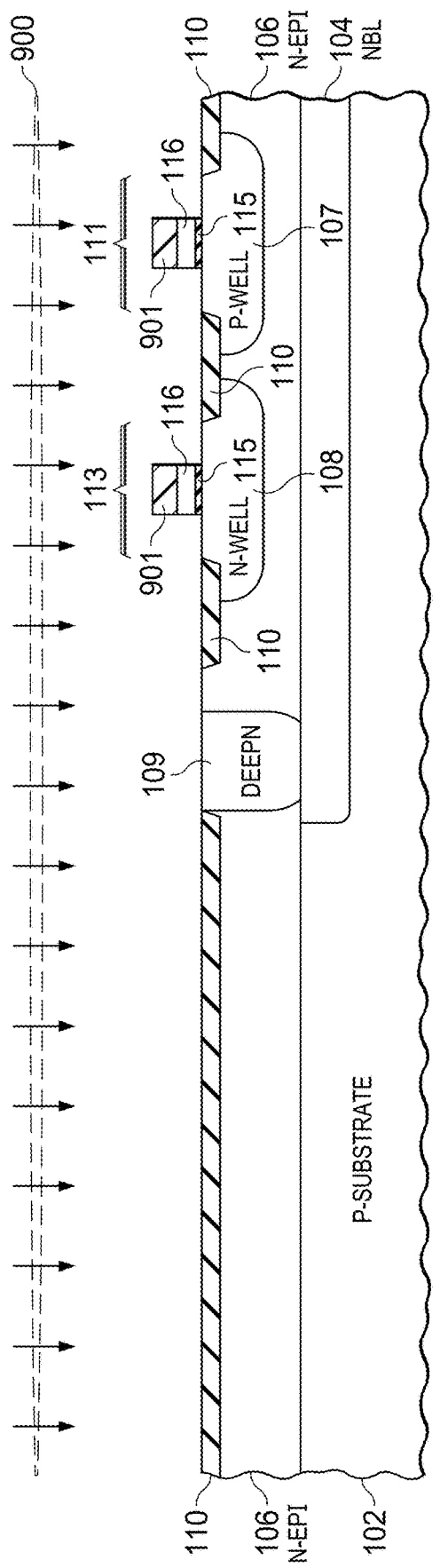

At 212 in FIG. 2, polysilicon is deposited. FIG. 8 shows one example, in which a blanket deposition process 800 is performed that deposits a polysilicon layer 116 on the top surface of the gate dielectric layer 115, for example, to a thickness of 50 to 150 nm. The polysilicon layer 116 is then patterned at 214. FIG. 9 shows one example, in which an etch process 900 is performed using an etch mask 901 to define the gate regions of the transistors 111 and 113 to leave the respective patterned gate oxide and electrode structures 115 and 116.

Figure 10:
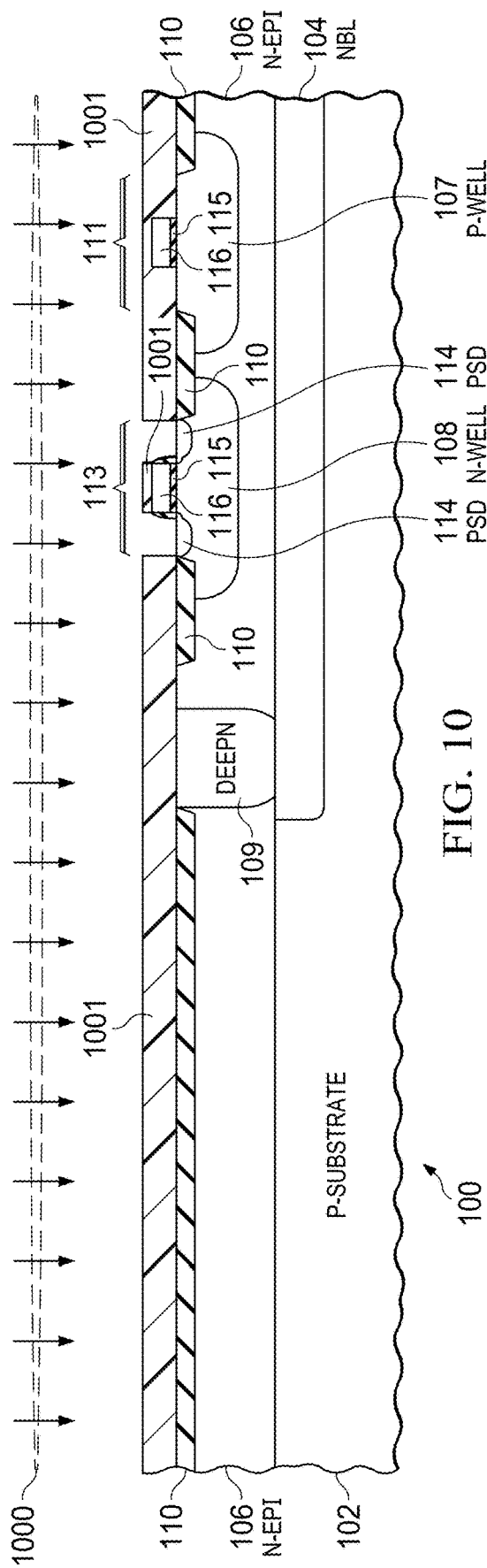
Figure 11:
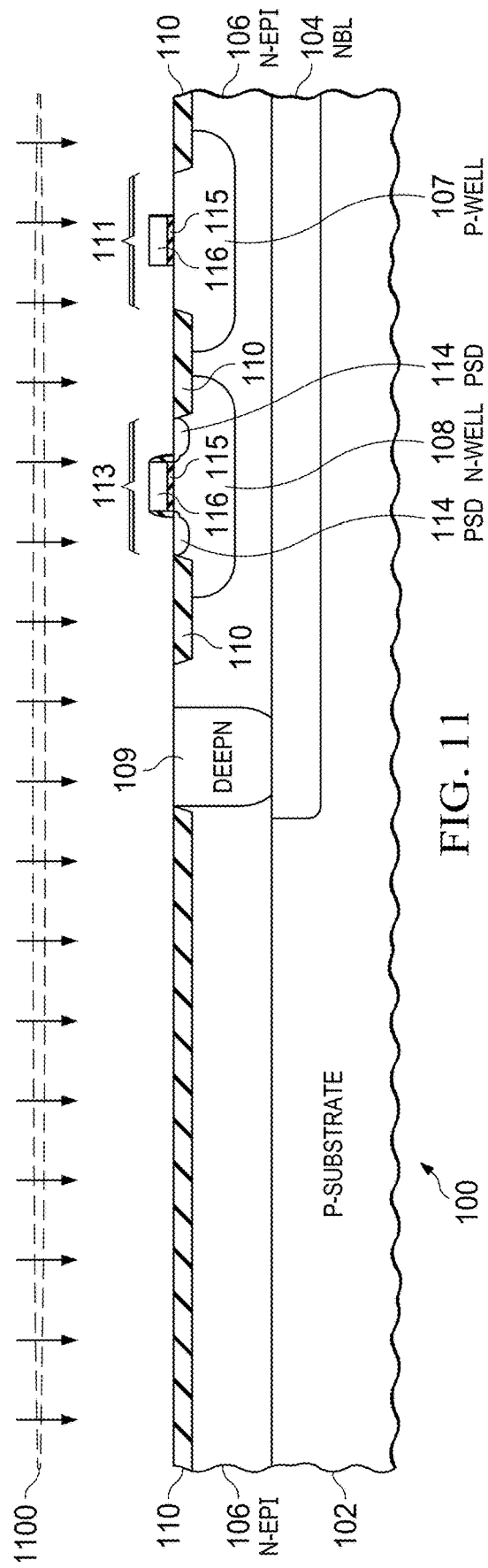
Figure 12:
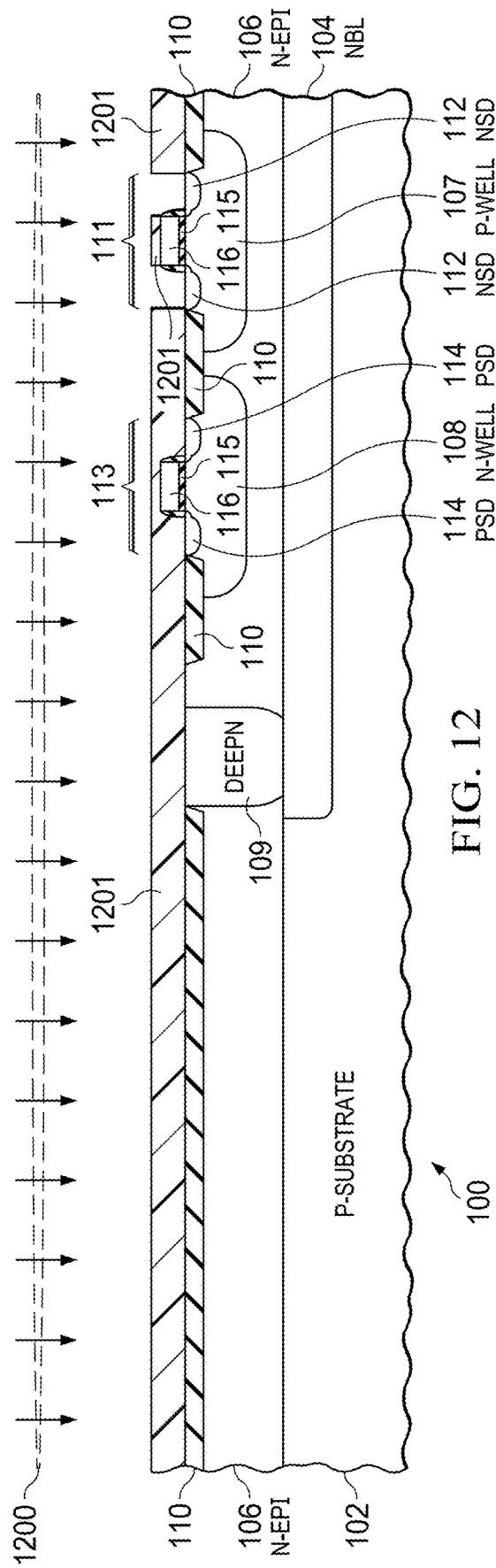

Referring also to FIG. 10-12, the method 200 further includes source/drain implants and formation of offset spacers, such as silicon dioxide and/or silicon nitride (e.g., 1 to 10 nm thick, not numerically designated in the figures) on lateral surfaces of the patterned gate structures 115, 116, for example, by oxidizing exposed surfaces of the gate or gates 116 and/or depositing a layer of silicon dioxide or silicon nitride followed by anisotropic etching (not shown). The implants and sidewall spacer formation can be in any suitable order, for example, including lightly doped drain (LDD) implants and shallow implantations before formation of sidewall spacers, followed by further (e.g., deeper) source/drain implants, separately for the transistors 111 and 113.

In one example, p-type dopants are implanted at 216 in FIG. 2 into the top side of the semiconductor surface layer 106 in the n-doped well 108 to form all or a portion of the source/drain implanted portions 114. FIG. 10 shows one example, in which an implantation process 1000 is performed using an implant mask 1001 that implants p-type dopants (e.g., boron) into the source/drain implanted portions 114. The method 200 also includes p-type source/drain implant annealing at 218. FIG. 11 shows one example, in which an anneal process 1100 is performed that anneals the p-type dopants of the source/drain implanted portions 114.

At 220, an n-type source/drain implantation is performed to form the source/drain implanted portions 112. FIG. 12 shows one example, in which an implantation process 1200 is performed using another implant mask 1201. The process 1200 implants n-type dopants (e.g., phosphorus) into the source/drain implanted portions 112 of the semiconductor surface layer 106 along the top side in the p-doped well 107. In this example, sidewall spacers are formed along the sidewalls of the gate structure 115, 116 of the n-channel transistor 111, for example, by oxidizing exposed surfaces of the gate 116, and/or depositing a layer of silicon dioxide or silicon nitride followed by anisotropic etching (not shown).

The method 200 in this example includes forming a silicon-rich dielectric layer at 222 on a side of the isolation structure 110. In various implementations, the silicon-rich dielectric layer is or includes one of silicon-rich nitride, silicon-rich oxide, silicon-rich carbide, silicon-rich silicon carbon nitride (SiCN), and silicon-rich oxynitride (SiON). FIG. 13 shows one example, in which a deposition process 1300 is performed that forms a silicon-rich dielectric layer 1301 on the dielectric material of the isolation structure 110, and onto the transistors 111 and 113. The silicon-rich dielectric layer 1301 in one example is one of a silicon-rich nitride layer, a silicon-rich oxynitride layer, and a silicon-rich carbon nitride layer, referred to as a stress memorization technique (SMT) layer on the top surface of the device 100 prior to annealing the n-type implanted source/drain regions 112. The example silicon nitride layer 1301 has a silicon to nitrogen atomic ratio of approximately 1.5 to 10 as measured by an elemental analysis technique. In another example, the silicon-rich dielectric layer 1301 is a silicon-rich oxide layer or a silicon-rich oxynitride layer having a silicon to oxygen atomic ratio of approximately 1.0 to 10 as measured by an elemental analysis technique. In another example, the silicon-rich dielectric layer 1301 is a silicon-rich carbide layer or a silicon-rich carbon nitride layer having a silicon to carbon atomic ratio of approximately 1.5 to 10 as measured by an elemental analysis technique. Lower ratios than these examples inhibit the formation of silicide, whereas higher ratios act more like polysilicon and may not have as good performance with respect to use in the described passive component examples.

The following describes the processing using the example silicon-rich nitride layer 1301, and the processing steps are the same or similar for other implementations that use silicon-rich oxide or silicon-rich carbide. In this example, the silicon-rich nitride layer 1301 is deposited to a thickness of 10 to 200 nm, with a tensile stress between 200 and 1500 MPa. In this or another example, the deposited silicon-rich nitride layer 1301 is a silicon-rich nitride material having an atomic ratio of silicon to nitrogen (Si/N) of about or greater than 1.5 and about or less than 10 as measured by elemental analysis techniques. In another example, the deposited silicon-rich nitride layer 1301 is a silicon-rich nitride material $Si_xN_y$ having a ratio of x/y that is greater than 1, such as about 1.5. In this or another example, the deposited silicon-rich nitride layer 1301 is a silicon-rich nitride material $Si_xN_y$ having a ratio of x/y that is greater than or equal to 1 and less than or equal to 20.

At 224, the method 200 further comprises annealing to anneal the n-type implanted source/drain regions 112. FIG. 14 shows one example, in which a rapid thermal anneal (RTA) process 1400 is performed that anneals the n-type implanted source/drain regions 112 and the transistors 111 and 113 with the silicon-rich nitride layer 1301 thereon. In one implementation, the anneal process 1400 heats the structure to 850 to 1100 degrees C. for 1 to 60 seconds by radiant energy to recrystallize the implanted source/drain regions 112 and 114 and the amorphous portions of the gates 116 in a manner that introduces tensile stress, for example, between 50 and 1000 MPa to the gate 116 of the n-channel transistor 111 after the silicon-rich nitride layer 1301 is subsequently removed. This advantageously increases the on-state current-carrying capacity of the n-channel transistor 111. In addition, as discussed further below, certain implementations also use the silicon-rich nitride layer 1301 for silicidation of the passive components (e.g., resistor 121, capacitor 126 and fuse 128) to provide the benefits of silicide metal components structures without adding additional process steps during fabrication.

In one example, (e.g., FIGS. 25-28 below), the silicon-rich nitride layer 1301 is patterned to remain on the STI isolation structure(s) 110 in the prospective passive component portions and the remainder of the silicon-rich nitride layer 1301 is removed, and a silicidable metal is deposited directly onto the remnant portions of the silicon-rich nitride layer 1301, followed by annealing to form silicide metal in the prospective passive component portions.

Figure 15:
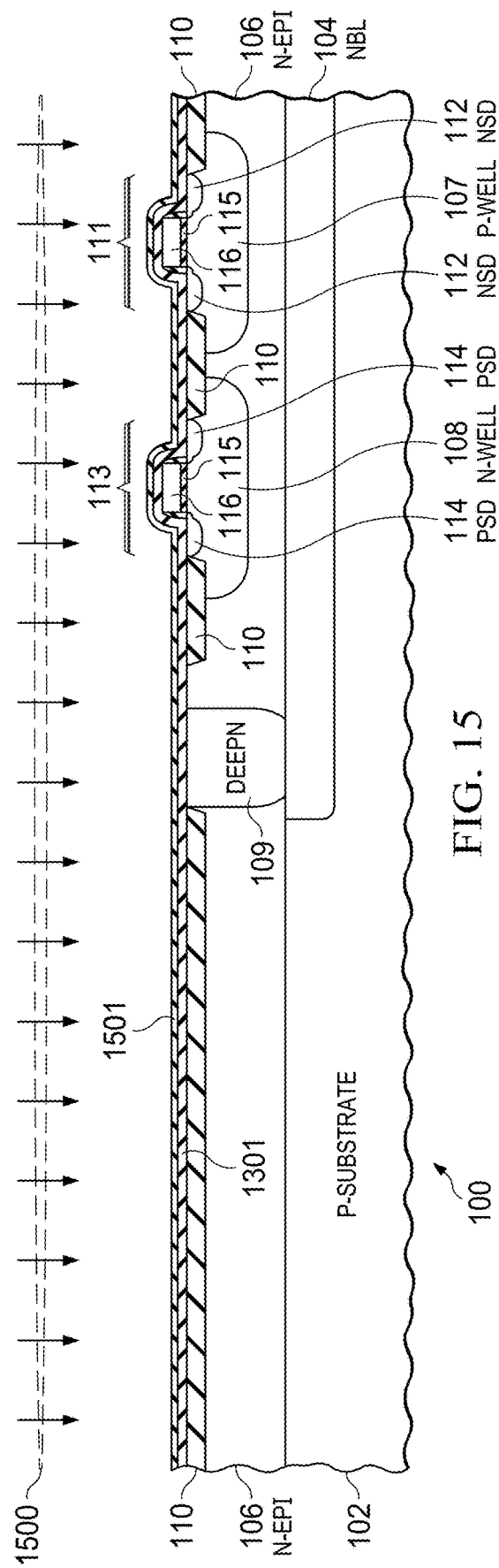
Figure 16:
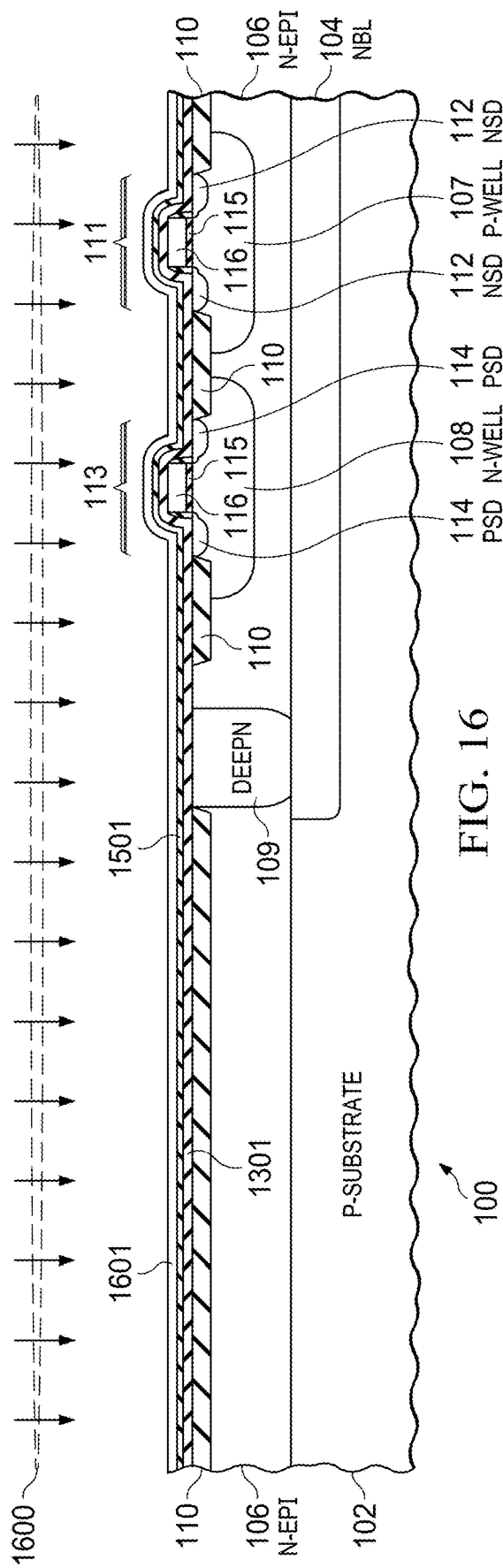

In the example of FIGS. 15 and 16, further layers are deposited to facilitate the formation of the local silicide metal structures for the passive circuit components. At 225 in this implementation, the method 200 further includes depositing an oxynitride later on the silicon-rich nitride layer 1301. FIG. 15 shows one example, in which a deposition process 1500 is performed that deposits an oxynitride layer 1501 on the silicon-rich nitride layer 1301. This implementation also includes depositing a polysilicon layer on the oxynitride layer 1501 at 226 in FIG. 2. FIG. 16 shows one example, in which a further deposition process 1600 is performed that deposits a polysilicon layer 1601 on the oxynitride layer 1501.

Referring also to FIG. 17, the layers 1301, 1501 and 1601 are patterned at 228 in FIG. 2 to remove all these layers outside the prospective passive circuit component regions. FIG. 17 shows one example, in which an etch process 1700 is performed using an etch mask 1701 to pattern the polysilicon layer 1601, the oxynitride layer 1501, and the silicon-rich nitride layer 1301.

A silicidable metal is deposited at 230 in FIG. 2. FIG. 18 shows one example, in which a deposition process 1800 is performed that deposits a silicidable metal layer 1801 on the polysilicon layer 1601, which is above the patterned silicon-rich nitride layer 1301. In one implementation, the silicidable metal layer 1801 is or includes titanium, cobalt, tungsten, nickel-platinum, and/or nickel. Other silicidable metals can be used in other implementations. In the illustrated example, moreover, the deposition process 1800 deposits the silicidable metal layer 1801 on the gate electrodes 116 and the implanted source/drain regions 112 and 114 on or in the semiconductor surface layer 106 for concurrently forming silicide contacts for the transistors 111 and 113.

Figure 19:
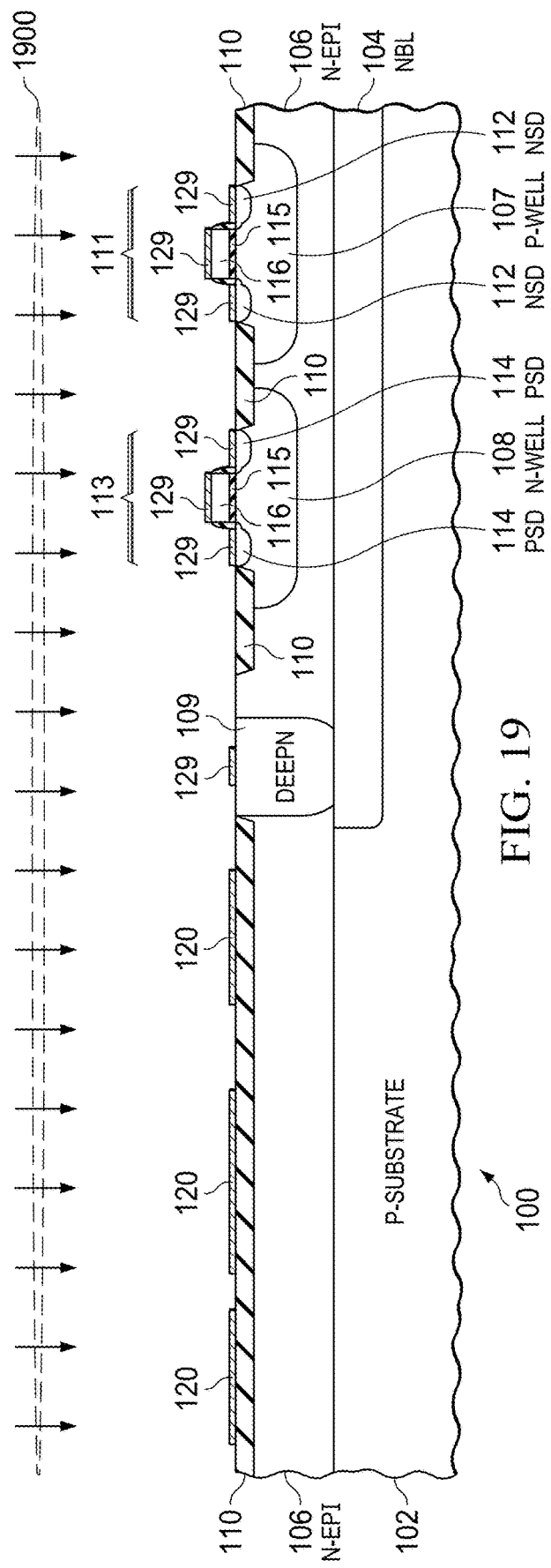

At 232, a first anneal is performed to form metal silicide by silicidation of the layers 1301, 1501, 1601 with the silicidable metal layer 1801 in the prospective passive circuit component regions. The first annealing at 232 concurrently forms metal silicide for transistor source/drain contacts by silicidation of silicon of the implanted silicon portions 112 and 114 of the semiconductor surface layer 106 with the silicidable metal layer 1801, and also forms metal silicide for the transistor gate electrodes 116 by silicidation of the doped polysilicon 116 with the silicidable metal layer 1801. In one example, the formed metal silicide structures 120 are or include nickel silicide, nickel-platinum silicide, cobalt silicide, titanium silicide, tungsten silicide, or another metal silicide. FIG. 19 shows one example, in which a thermal annealing process 1900 has annealed the silicon nitride layer 1301, the oxynitride layer 1501, the polysilicon layer 1601, and the silicidable metal layer 1801 shown in FIG. 18, resulting in the metal silicide structures 120 on the top side of the isolation structure 110. As discussed above, the metal silicide structures 120 include the metal silicide portion 125 and the dielectric portion 127, where the atomic ratio of silicon to the constituent atom of the starting silicon-rich dielectric layer 1301 (e.g., nitrogen, oxygen, or carbon) decreases after some of the silicon in the starting silicon-rich dielectric reacts and bonds with metal atoms after silicidation.

The annealing process 1900 concurrently anneals silicon of the source/drains 112, 114 with the silicidable metal layer 1801 to form metal silicide source/drain contacts 129 and anneals polysilicon of the gates 116 with the silicidable metal layer 1801 to form metal silicide gate contacts 129.

Figure 20:
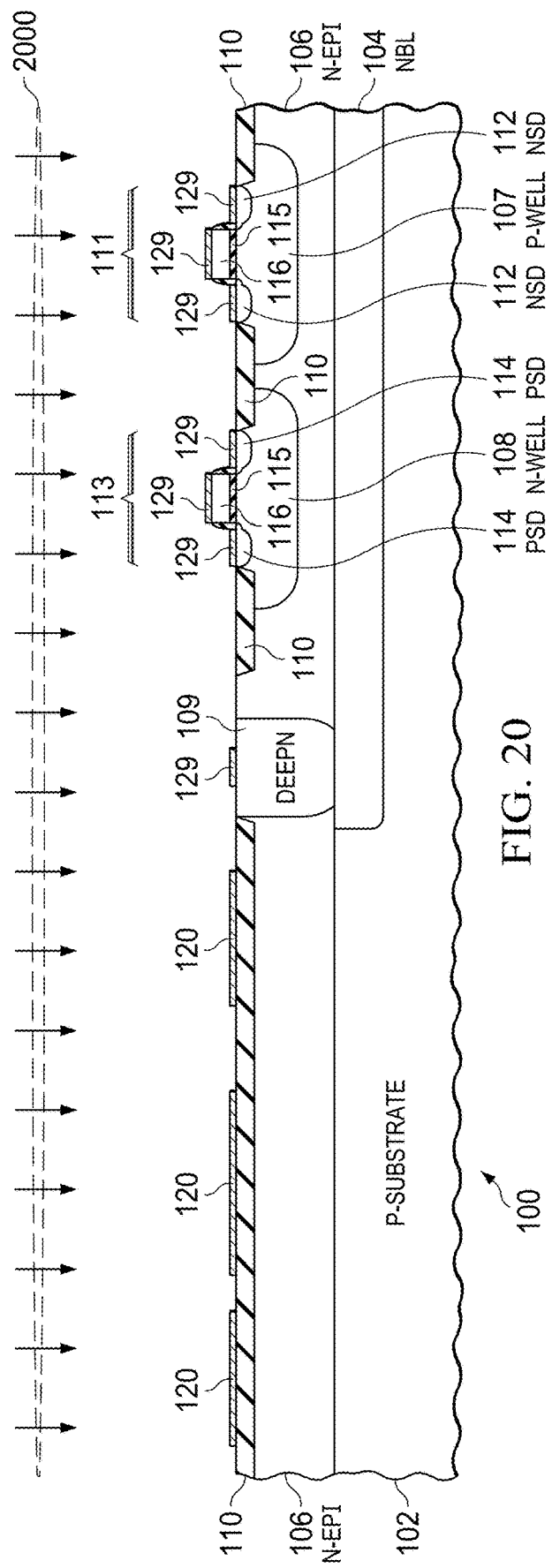
Figure 21:
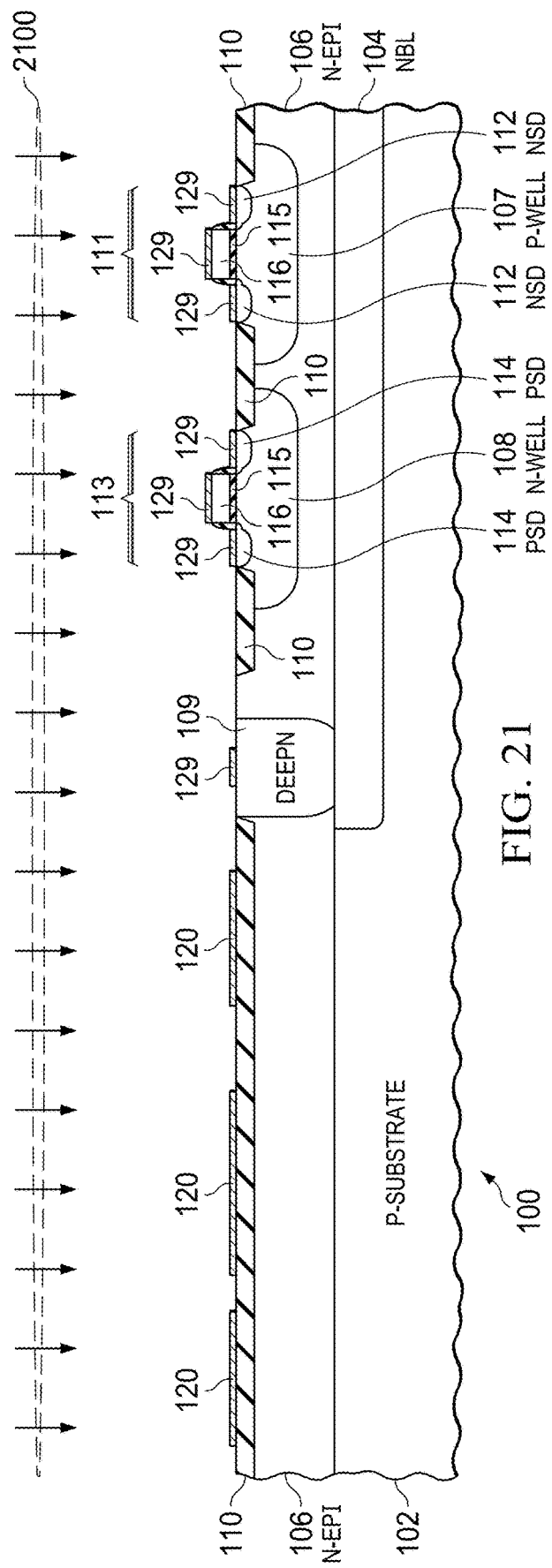

The method 200 further includes removing substantially all unreacted metal from the metal silicide structures 120 at 234. FIG. 20 shows one example, in which a process 2000 is performed that removes substantially all unreacted silicidable metal from the metal silicide structures 120. In one example, another anneal is performed at 235. FIG. 21 shows an example, in which an anneal process 2100 is performed.

Figure 22:
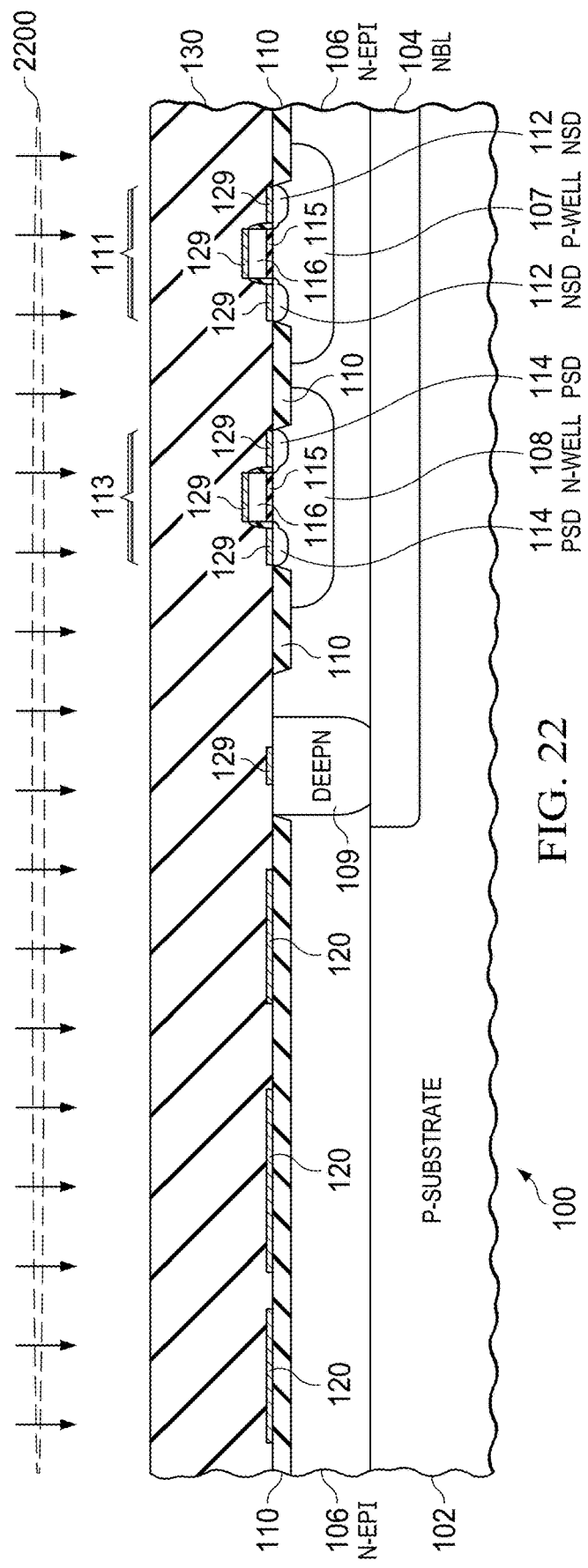

At 236 in FIG. 2, a dielectric (e.g., PMD) layer is formed. FIG. 22 shows one example, in which a deposition process 2200 is performed that forms the PMD dielectric layer 130 on the semiconductor surface layer 106, the isolation structures 110, and the metal silicide structures 120 and 129. In one example, the dielectric layer 130 is or includes a dielectric layer stack including a silicon nitride or silicon dioxide PMD liner (not shown) having a thickness of 10 to 100 nm formed by plasma enhanced chemical vapor deposition (PECVD), as well as a layer of silicon dioxide, phosphosilicate glass (PSG) or borophosphosilicate glass (BPSG) to a thickness of 100 to 1000 nm formed by PECVD and leveled or planarized by a CMP process, and an optional PMD cap layer (not shown) having a thickness of 10 to 100 nm that is or includes a hard material such as silicon nitride, silicon carbide nitride or silicon carbide.

Figure 23:
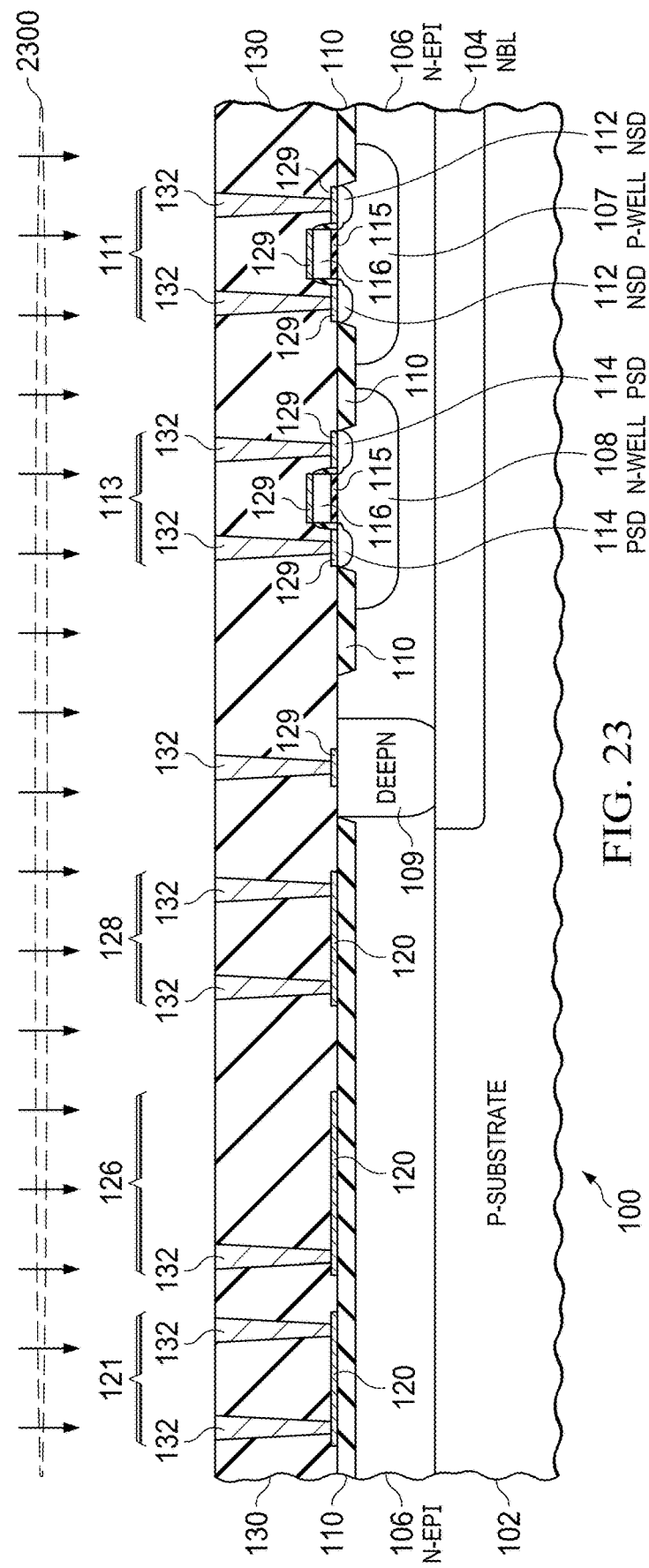

At 238, conductive contacts (e.g., tungsten) are formed through the dielectric layer 130. FIG. 23 shows one example, in which a process 2300 is performed that forms the conductive contacts 132 through respective locations in the PMD dielectric layer 130 to contact the metal silicide structures 120 of the passive circuit components 121, 126, and 128, and to contact the metal silicide structures 129 of the source/drains 112 and 114 and the gate electrodes 116 of the transistors 111 and 113. In one example, the process 2300 includes etching contact holes in the PMD dielectric layer 130 to expose the metal silicide structures 120 and 129, and filling the contact holes with contact metal, such as tungsten, such that electrical connections between the contacts 132 and the respective metal silicide structures 120 and 129 are formed.

At 240, one or more ILD dielectric layers and associated metal routing trace features and vias are formed to create a single or multilayer metallization structure (e.g., the ILD layer 140, conductive trace features 142 and vias 144 in FIG. 1). The metallization structure couples the metal silicide structures 120 and the terminals of the passive circuit components to one or more respective circuits and provides electrical coupling of the transistor source, drain, and gate terminals.

Figure 24:
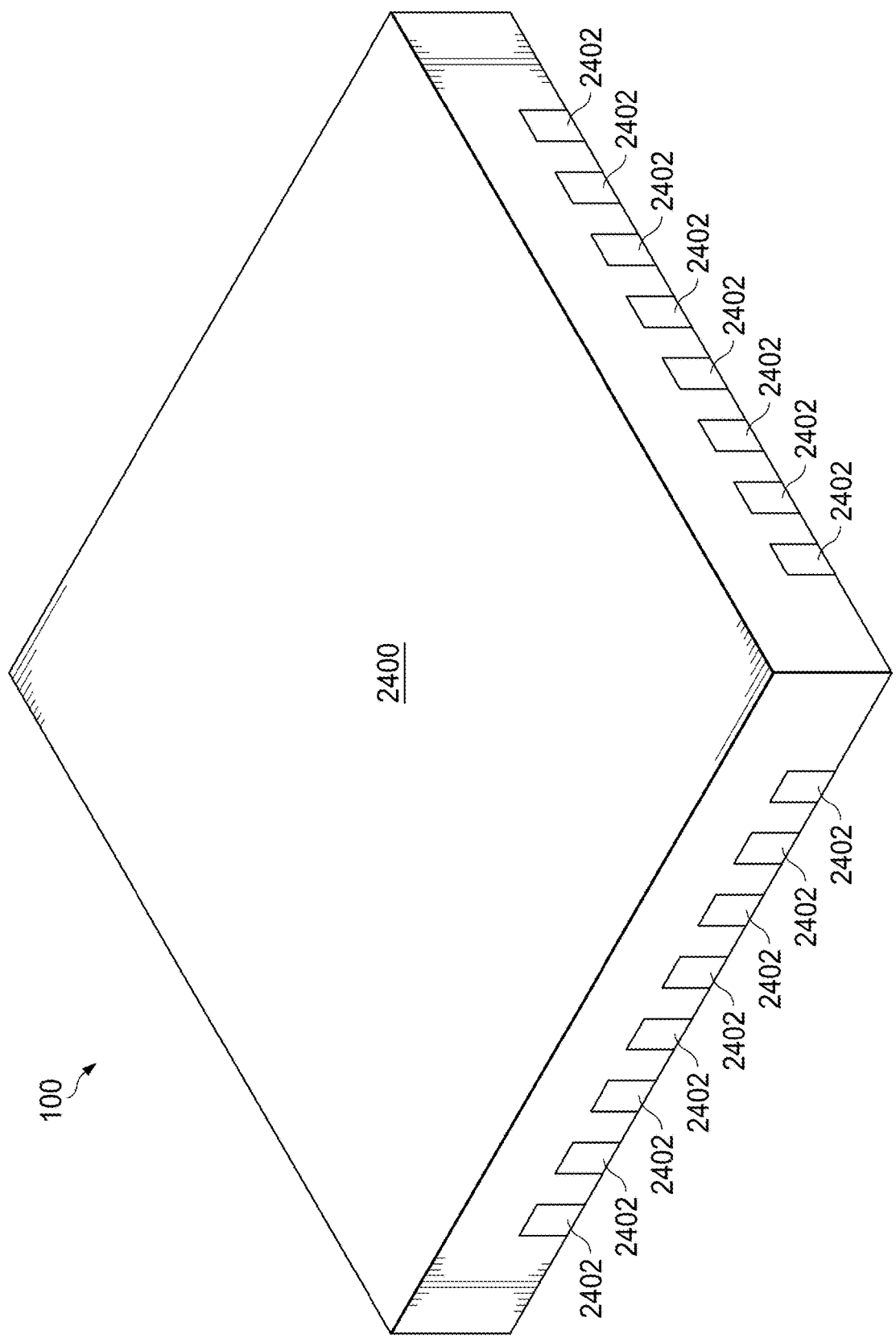
FIG. 24 is a perspective view of the packaged electronic device of FIGS. 1 and 3-23.

The processed wafer undergoes wafer probe testing and individual semiconductor dies are separated or singulated from the wafer and packaged at 242 in FIG. 2. FIG. 24 shows an example of a resulting packaged electronic device 100 with a molded package structure 2400 and conductive leads 2402.

FIGS. 25-28 show the electronic device 100 undergoing an alternative implementation of the method 200, in which the depositions at 225 and 226 are omitted. In this example, the silicon-rich nitride layer 1301 is patterned at 228 to remain on the STI isolation structure(s) 110 in the prospective passive component portions and the remainder of the silicon-rich nitride layer 1301 is removed. FIG. 25 shows one example in which an etch process 2500 is performed using an etch mask 2501 to pattern the silicon-rich nitride layer 1301.

A silicidable metal is then deposited at 230 as described above. FIG. 26 shows one example, in which a deposition process 2600 is performed that deposits a silicidable metal layer 2601 on the patterned silicon-rich nitride layer 1301. In one implementation, the silicidable metal layer 2601 is or includes titanium, cobalt, tungsten, nickel-platinum, and/or nickel. Other silicidable metals can be used in other implementations. In the illustrated example, moreover, the deposition process 2600 deposits the silicidable metal layer 2601 on the gate electrodes 116 and the implanted source/drain regions 112 and 114 on or in the semiconductor surface layer 106 for concurrently forming silicide contacts for the transistors 111 and 113.

Figure 27:
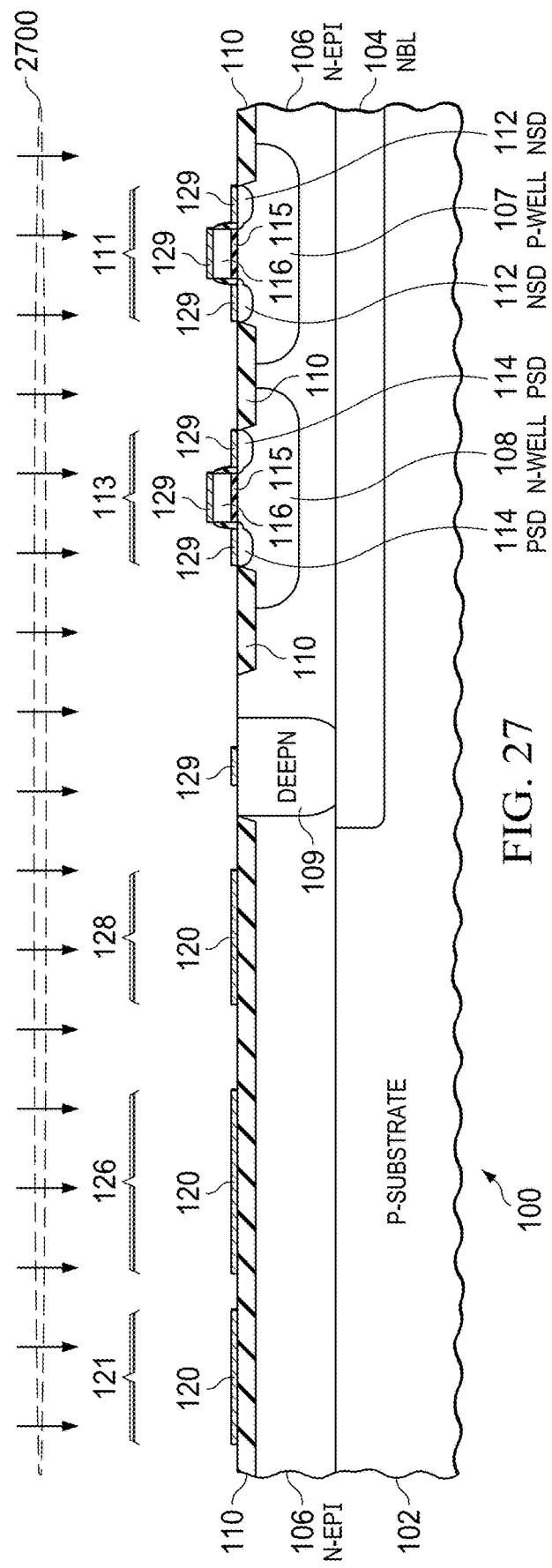

At 232 in this implementation, a first anneal is performed to form metal silicide by silicidation of the silicon rich nitride layer 1301 with the silicidable metal layer 2601 in the prospective passive circuit component regions. FIG. 27 shows one example in which an annealing process 2700 is performed that concurrently forms metal silicide 129 for transistor source/drain contacts by silicidation of silicon of the implanted silicon portions 112 and 114 of the semiconductor surface layer 106 with the silicidable metal layer 2601, and also forms metal silicide 129 for the transistor gate electrodes 116 by silicidation of the doped polysilicon 116 with the silicidable metal layer 2601. In one example, the formed metal silicide structures 120 and 129 are or include nickel silicide, nickel-platinum silicide, cobalt silicide, titanium silicide, tungsten silicide, or another metal silicide. As discussed above, the metal silicide structures 120 include the metal silicide portion or portions 125 and the dielectric portion or portions 127. The annealing process 2700 anneals the silicon nitride layer 1301 and the silicidable metal layer 2601 to form the metal silicide structures 120 on the top side of the isolation structure 110. The annealing process 2700 concurrently anneals silicon of the source/drains 112, 114 with the silicidable metal layer 2601 to form metal silicide source/drain contacts 129 and anneals polysilicon of the gates 116 with the silicidable metal layer 2601 to form the metal silicide gate contacts 129.

Figure 28:
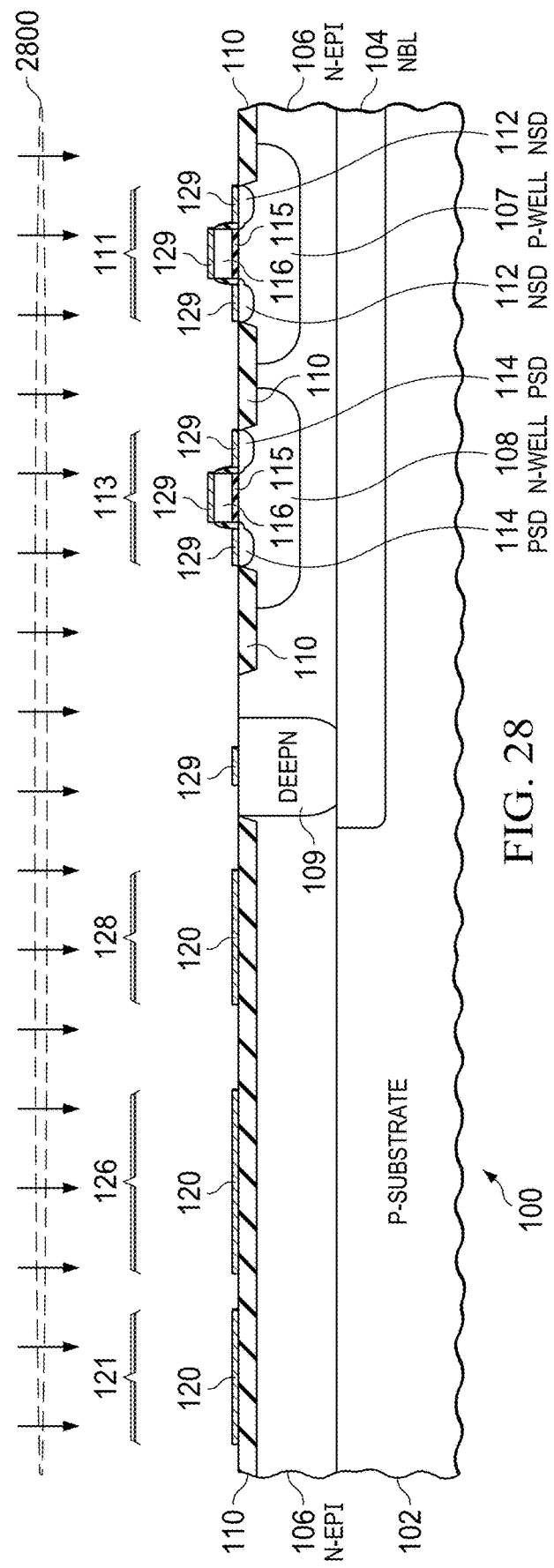

The method 200 further includes removing substantially all unreacted silicidable metal from the metal silicide structures 120 and 129 at 234. FIG. 28 shows one example, in which a process 2800 is performed that removes substantially all unreacted silicidable metal from the metal silicide structures 120. In one example, another anneal is performed at 235. The device 100 is then further processed at 236, 238, 240 and 242 as described above. This example uses the SMT silicon-rich nitride layer 1301 to provide stress treatment of the n-channel transistor 111 and to also provide the benefits of metal silicide structures 120 in fabricating the passive circuit components 121, 126, and 128, with patterning using an existing silicide block mask without adding any cost or complexity to the manufacturing process.

Figure 29:
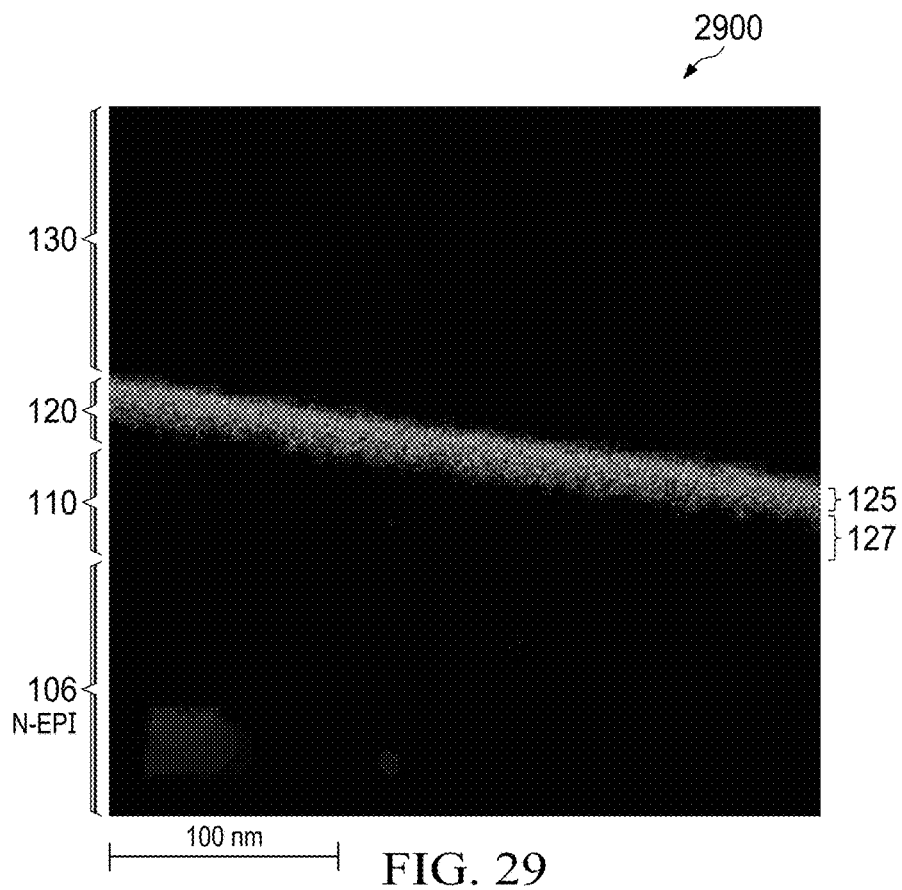
FIG. 29 is an electron energy loss spectroscopy (EELS) map image showing the presence of nickel in a partially silicided stress memorization technique (SMT) silicon-rich nitride layer.
Figure 30:
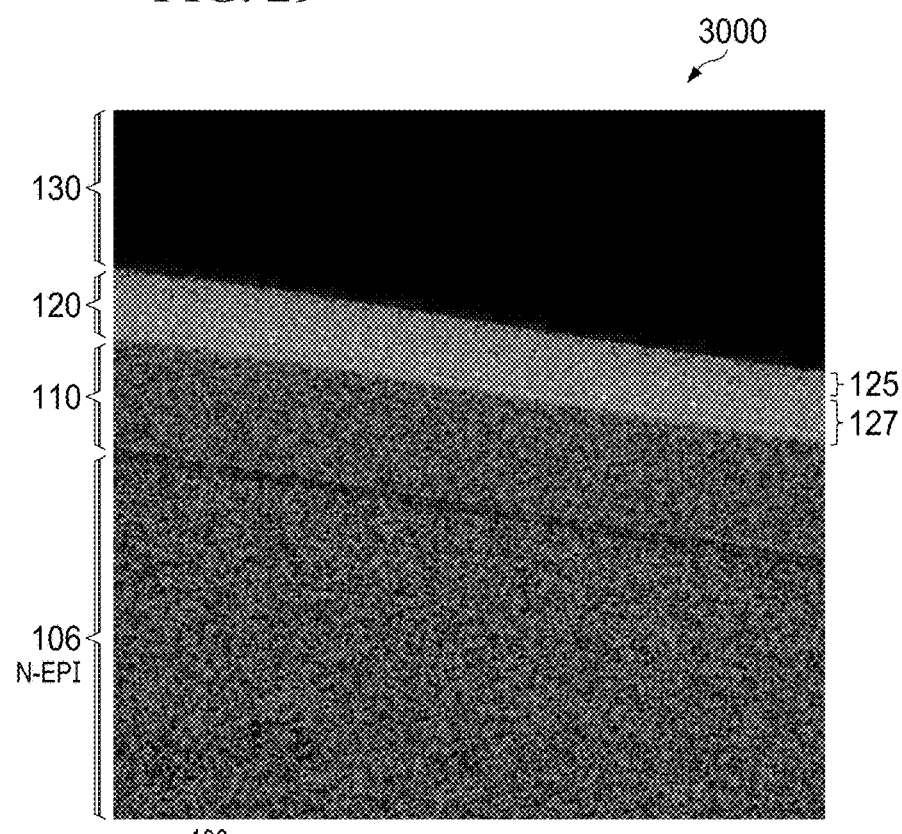
FIG. 30 is an EELS map image showing the presence of nitrogen in the partially silicided SMT silicon-rich nitride layer of FIG. 29.
Figure 31:
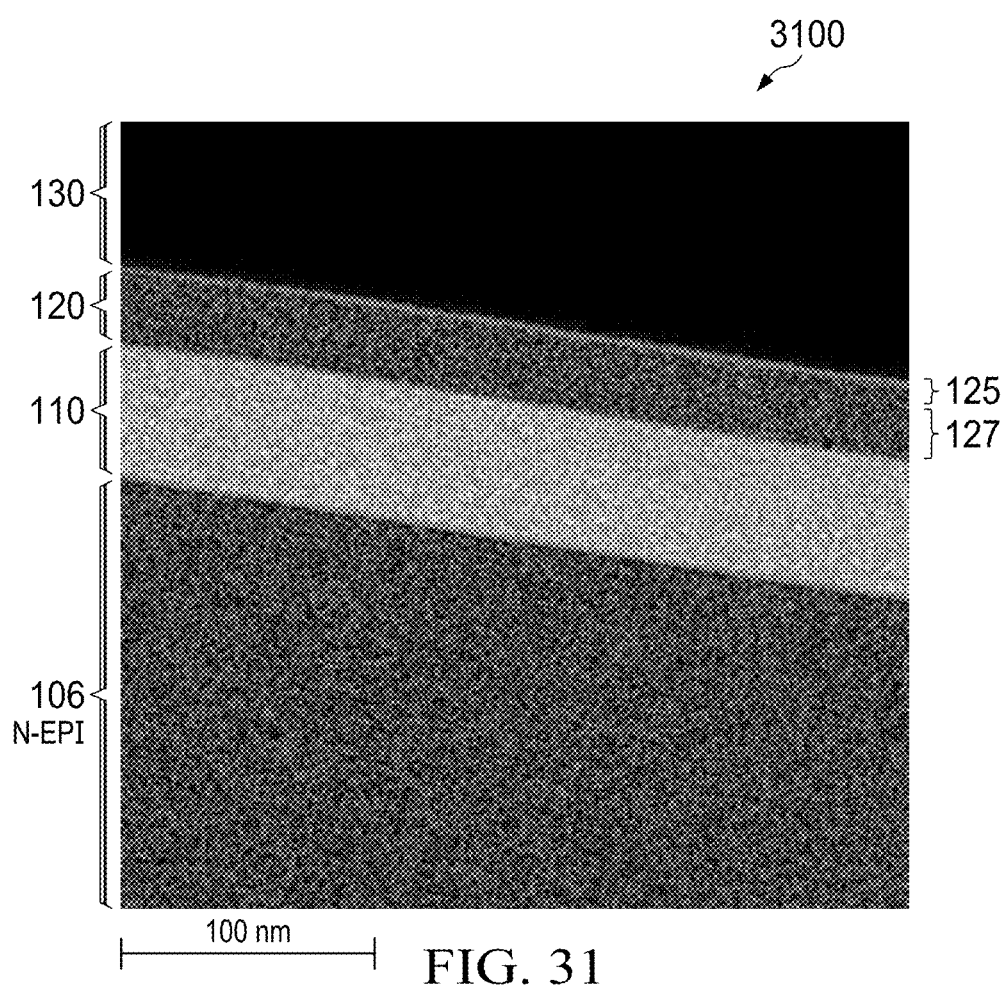
FIG. 31 is an EELS map image showing the presence of oxygen in the partially silicided SMT silicon-rich nitride layer of FIGS. 29 and 30.

Referring to FIGS. 29-31, the FIG. 29 shows an electron energy loss spectroscopy (EELS) map image 2900 that shows a portion of one of the metal silicide structures 120, including the presence of nickel in the metal silicide portion 125 between the PMD dielectric layer 130 and the dielectric portion 127. As described above, the dielectric portion 125 of the metal silicide structure 120 extends over (e.g., on) the STI structure 110, which is above the semiconductor surface layer 106. In this example, the metal silicide portion 125 of the silicide metal structure 120 has a thickness of approximately 140 Å, the entire metal silicide structure 120 has a thickness of approximately 300 Å, and the STI structure 110 (e.g., SiO2) has a thickness of approximately 500 Å. The image 2900 in FIG. 29 highlights the presence of nickel in the metal silicide portion 125. FIG. 30 shows an EELS nitrogen map image 3000 of the same portion of the electronic device showing the presence of nitrogen in the portions 125 and 127 of the silicide metal structure 120. FIG. 31 shows an EELS oxygen map image 3100 that indicates the presence of oxygen in the STI structure 110 in the same portion of the electronic device illustrated in FIGS. 29 and 30.

Figure 32:
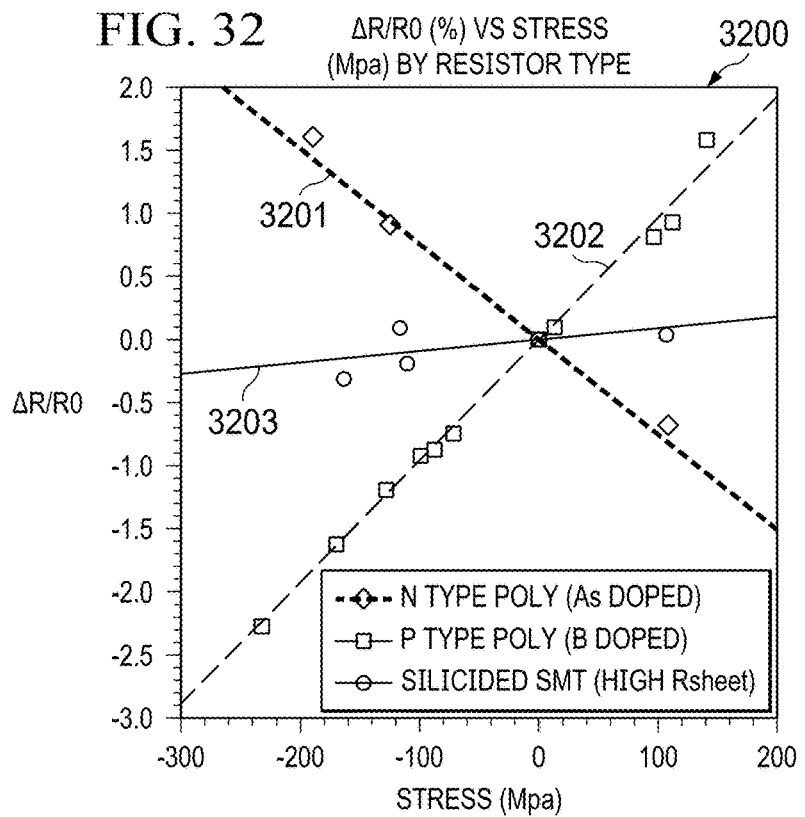
FIG. 32 is a stress coefficient of resistance vs. stress graph with data points for n-type doped polysilicon, p-type doped polysilicon, and silicided SMT silicon-rich nitride.
Figure 33:
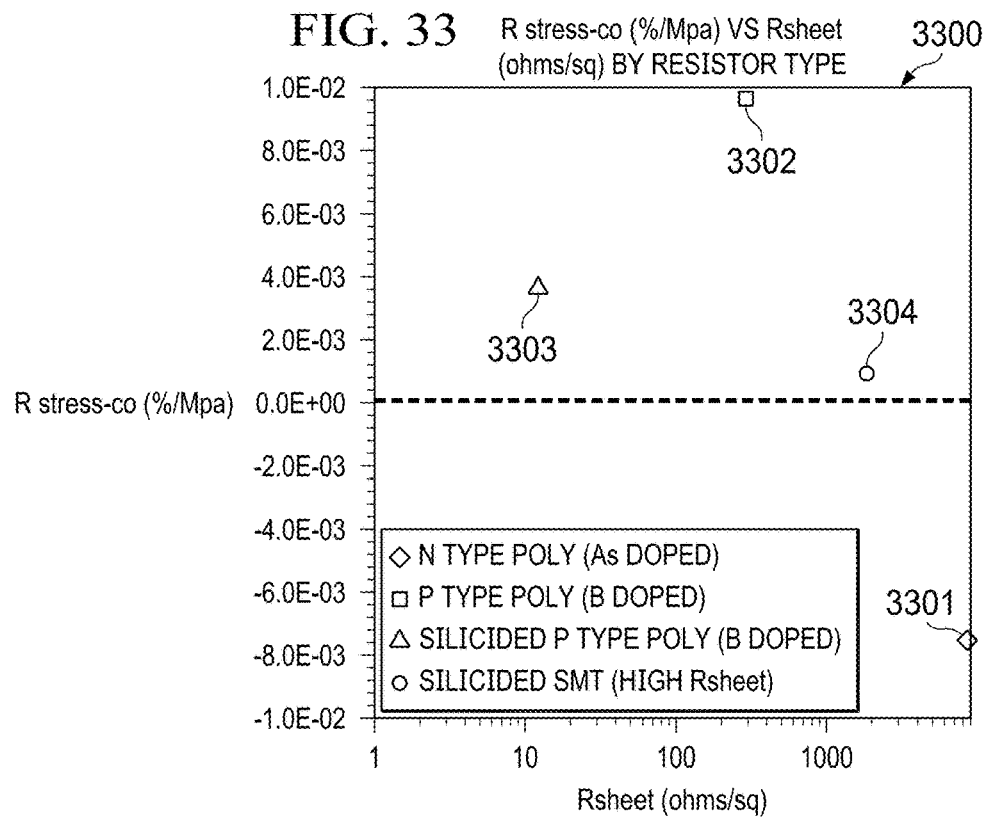
FIG. 33 is a stress coefficient of resistance vs. sheet resistance graph with curves for n-type doped polysilicon, p-type doped polysilicon, silicided p-type doped polysilicon, and silicided SMT silicon-rich nitride.
Figure 34:
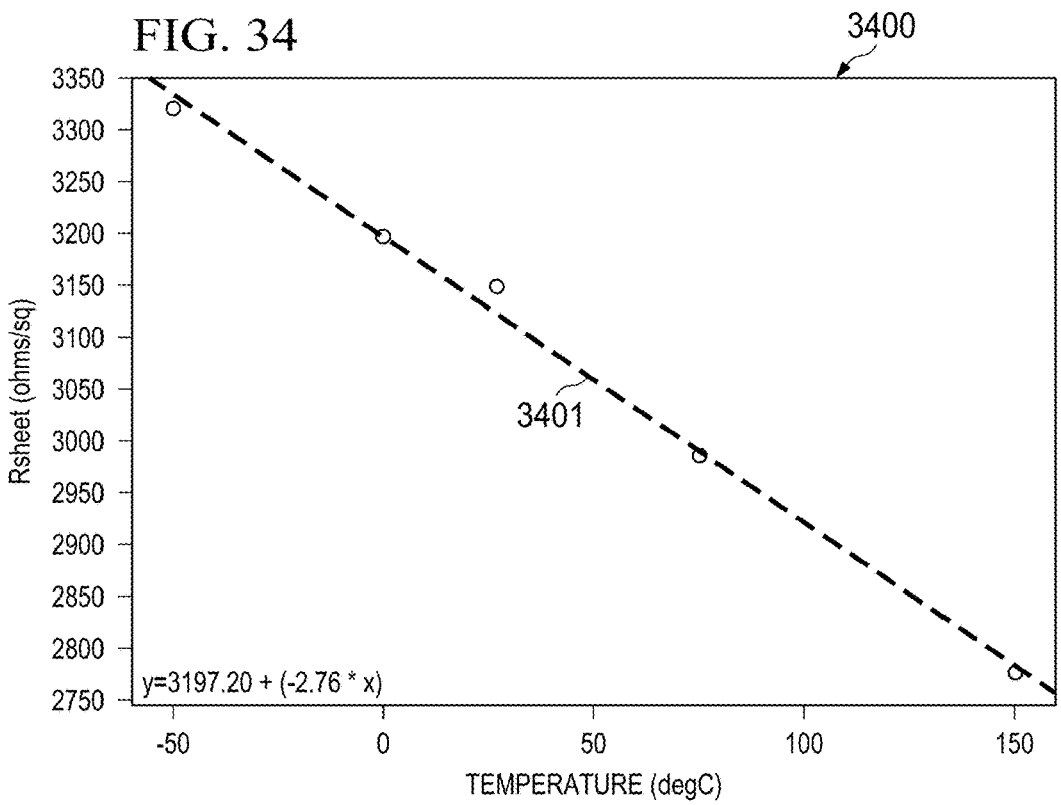
FIG. 34 is a sheet resistance vs. temperature graph for silicided SMT silicon-rich nitride.

Referring also to FIGS. 32-34, FIG. 32 shows a stress coefficient of resistance vs. stress graph 3200 with a curve 3201 and data points for n-type doped polysilicon, a curve 3202 and data points for p-type doped polysilicon, and a curve 3203 and data points for silicided SMT silicon-rich nitride. In this example, the metal silicide structure 120 provide significant advantages with respect to resistance coefficient uniformity with respect to stress as shown in the curve 3203, compared with doped polysilicon examples represented by the curves 3201 and 3202. FIG. 33 shows a stress coefficient of resistance vs. sheet resistance graph 3300 with a data point 3301 for n-type doped polysilicon, a data point 3302 for p-type doped polysilicon, a data point 3303 for silicided p-type doped polysilicon, and a data point 3304 for the example metal silicide structure 120 formed using silicided silicon-rich nitride. This example shows the improved resistance versus stress coefficient performance (data point 3304) of the metal silicide structure 120, which is much closer to zero than the other data points 3301-3303. The graphs 3230 and 3300 of FIGS. 32 and 33 demonstrate the high sheet resistance and low stress coefficient of resistance advantages of the metal silicide structure 120.

FIG. 34 shows a sheet resistance vs. temperature graph 3400 with a curve 34 one and data points representing the sheet resistance of the example metal silicide structure 120, which provides generally linear sheet resistance as a function of temperature. In this example, the metal silicide structure 120 shows a temperature coefficient of −876 ppm/ degree C. at a sheet resistance of approximately 3000 OHMs per square.

Figure 35:
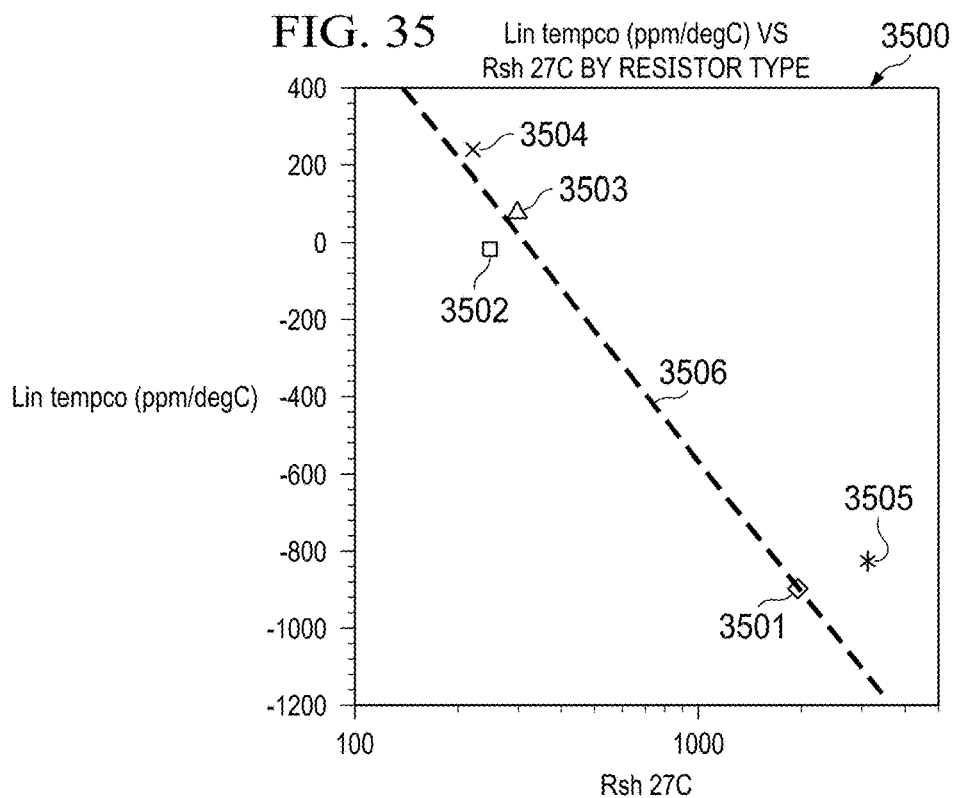
FIG. 35 is a temperature coefficient vs. sheet resistance graph for a silicided SMT silicon-rich nitride, and implanted polysilicon resistors.

FIG. 35 shows a temperature coefficient vs. sheet resistance graph 3500 for a silicided SMT silicon-rich nitride and implanted polysilicon resistors. The graph 3500 has data points 3501 3502, 3503, 3504, and 3506 for example implanted polysilicon resistors, a data point 3505 for the resistor 121 that includes the metal silicide structure 120, and a baseline curve 3506 for implanted polysilicon resistor structures. The data point 3505 shows that the temperature coefficient is approximately 250 ppm higher than an implanted polysilicon resistor. The graphs 3400 3500 of FIGS. 34 and 35 demonstrate the advantages with respect to temperature coefficient performance of the metal silicide structure 120, for example, in applications such as stress independent temperature coefficient sensors, electronic fuses, etc.

Figure 36:
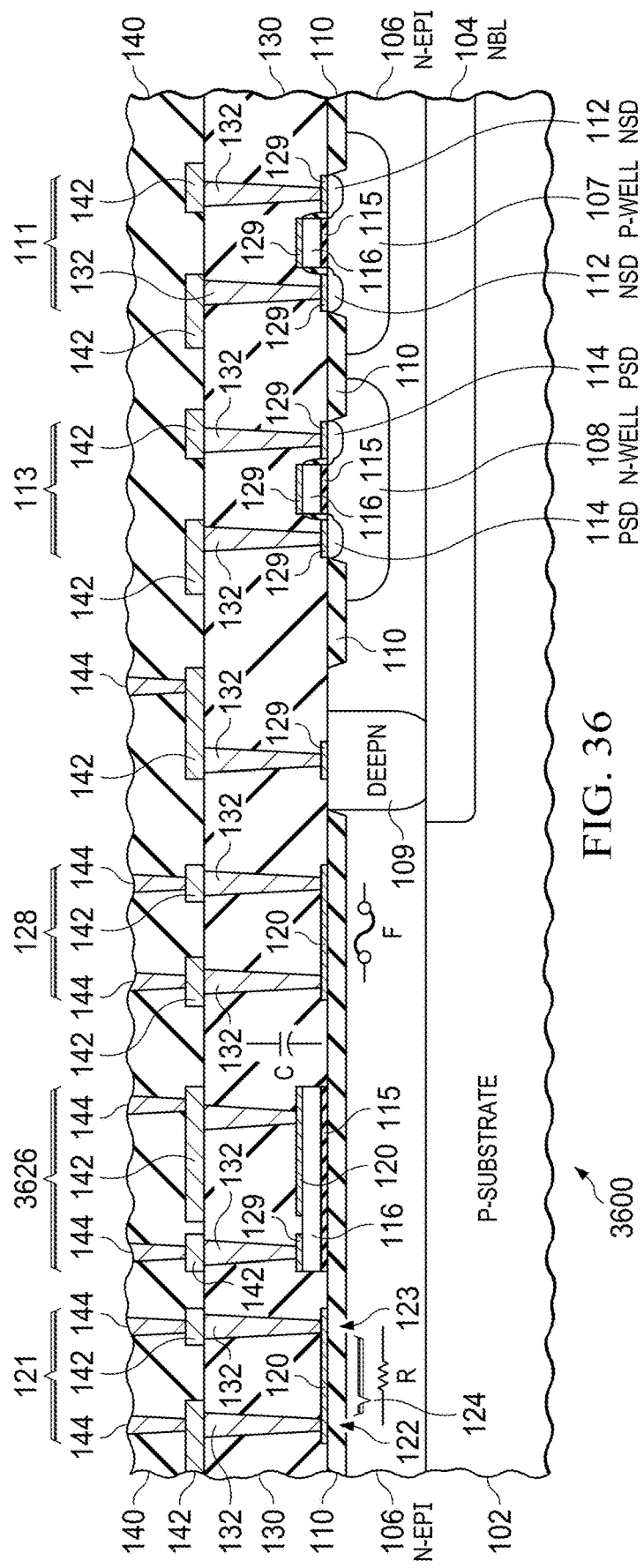
FIG. 36 is a partial sectional side elevation view of another electronic device with metal silicide passive circuit components on an isolation structure.
Figure 36A:
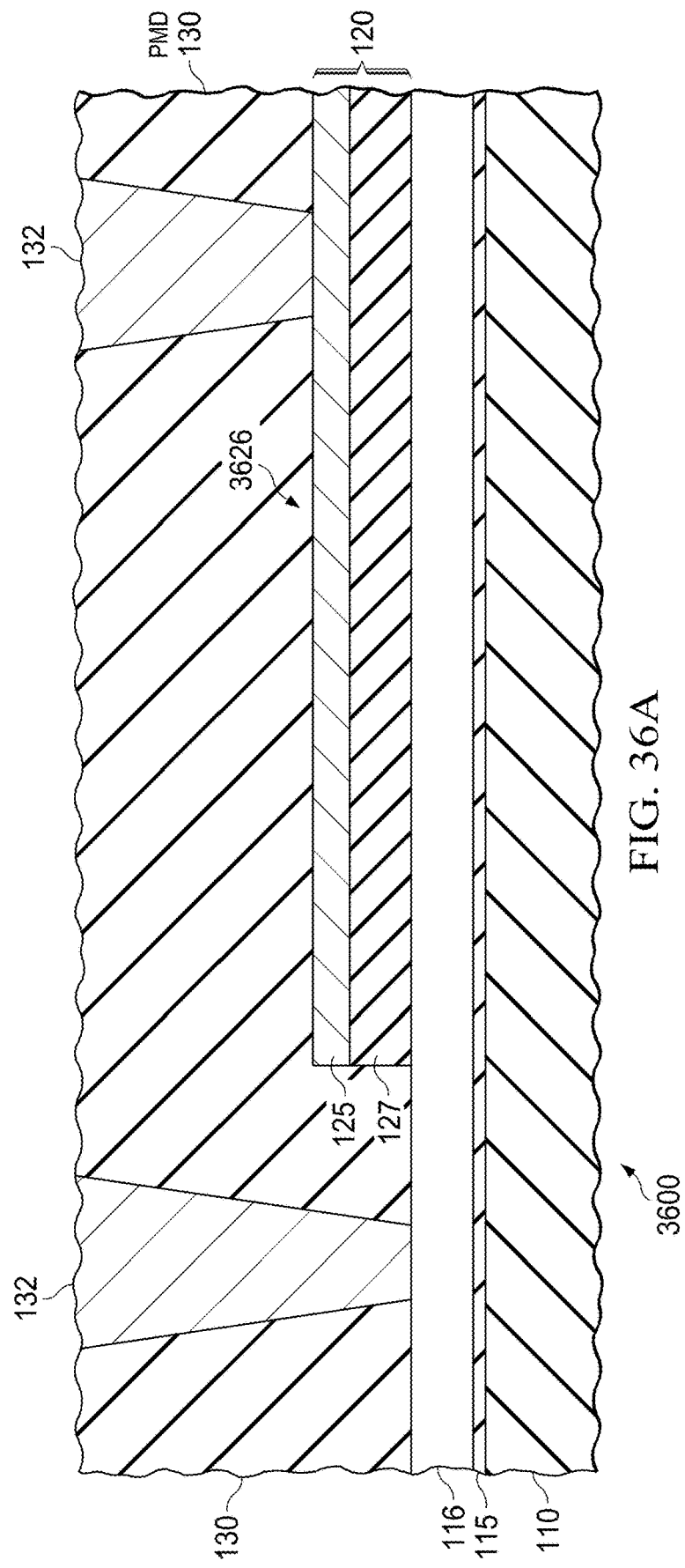
FIG. 36A is a partial sectional side elevation view of a portion of a metal silicide structure of a capacitor in the electronic device of FIG. 36.

FIG. 36 shows a partial sectional side elevation view of another example electronic device 3600 with metal silicide passive circuit components on an isolation structure, including various numbered structures similar to or the same as described above. FIG. 36A shows a partial sectional side elevation view of a capacitor 3626 in the electronic device 3600. In one example, the capacitor 3626 includes a bottom capacitor plate formed by doped polysilicon 116 formed on an oxide layer 115 above the STI structure 110. A metal silicide structure 120 is formed on a portion of the top side of the above the doped polysilicon 116, and the metal silicide structure 120 includes a metal silicide portion 125 on a dielectric portion 127 as described above. The metal silicide portion 125 forms a top capacitor plate of the capacitor 3626, and the intervening dielectric portion 127 forms the dielectric of the capacitor 3626 between the bottom and top capacitor plates. In one implementation, the doped polysilicon 116 and the oxide layer 115 of the capacitor 3626 are formed on the STI structure 110 concurrently with formation and patterning of the doped polysilicon and gate dielectric layer of the gate structure of one of the transistors 111, 113.

Modifications are possible in the described examples, and other implementations are possible, within the scope of the claims.

What is claimed is:

1. A method of forming a passive circuit component, the method comprising:
   forming an isolation structure extending into a semiconductor surface layer of a substrate;
   forming a silicon-rich dielectric layer on a side of the isolation structure, the silicon-rich dielectric layer selected from a first group consisting of silicon-rich nitride, silicon-rich oxide, and silicon-rich carbide;
   siliciding the silicon-rich dielectric layer to form a metal silicide structure of the passive circuit component;
   forming a dielectric layer over the semiconductor surface layer, the isolation structure, and the metal silicide structure;
   forming a conductive contact through the dielectric layer to contact the metal silicide structure; and
   forming a metallization structure over the dielectric layer to couple the metal silicide structure to a circuit.

2. The method of claim 1, wherein: the silicon-rich dielectric layer is one of a silicon-rich nitride material, a silicon-rich carbon nitride material, and a silicon-rich oxynitride material having a silicon-to-nitrogen atomic ratio of approximately 1.5 to 10 as measured by an elemental analysis technique.

3. The method of claim 1, wherein the silicon-rich dielectric layer is a silicon-rich oxide material or a silicon-rich oxynitride material having a silicon-to-oxygen atomic ratio of approximately 1.0 to 10 as measured by an elemental analysis technique.

4. The method of claim 1, wherein the silicon-rich dielectric layer is a silicon-rich carbide material or a silicon-rich carbon nitride material having a silicon-to-carbon atomic ratio of approximately 1.5 to 10 as measured by an elemental analysis technique.

5. The method of claim 1, wherein the isolation structure is a shallow trench isolation (STI) structure.

6. The method of claim 1, wherein the passive circuit component is a resistor.

7. The method of claim 1, wherein the passive circuit component is a capacitor.

8. The method of claim 1, wherein the passive circuit component is a fuse.

9. A method of forming an electronic device, the method comprising:
   forming a dielectric material of an isolation structure on or in a semiconductor surface layer;
   forming a material stack on a side of the isolation structure, including:
      performing a deposition process that deposits a silicon-rich dielectric layer on the dielectric material of the isolation structure, depositing an oxynitride layer on the silicon-rich dielectric layer, depositing a polysilicon layer on the oxynitride layer, and patterning the polysilicon layer, the oxynitride layer, and the silicon-rich dielectric layer;

siliciding the silicon-rich dielectric layer to form a metal silicide structure of a passive circuit component on the side of the isolation structure, the siliciding including:

performing a second deposition process that deposits a silicidable metal layer over the material stack, and annealing the material stack and the silicidable metal layer thereby forming the metal silicide structure on the side of the isolation structure; and removing substantially all unreacted metal from the metal silicide structure.

10. The method of claim 9, wherein the silicon-rich dielectric layer is a stress memorization technique (SMT) layer.

11. The method of claim 9, wherein the second deposition process deposits the silicidable metal layer directly on the patterned silicon-rich dielectric layer.

12. The method of claim 11, wherein:

the second deposition process deposits the silicidable metal layer on a gate and a source/drain on or in the semiconductor surface layer; and the annealing the material stack and the silicidable metal layer concurrently:

anneals silicon of the source/drain with the silicidable metal layer to form a metal silicide source/drain contact, anneals polysilicon of the gate with the silicidable metal layer to form a metal silicide gate contact, and anneals the material stack and the silicidable metal layer to form the metal silicide structure on the side of the isolation structure.

13. The method of claim 9, wherein:

the second deposition process deposits the silicidable metal layer on a gate and a source/drain on or in the semiconductor surface layer; and the annealing the material stack and the silicidable metal layer concurrently:

anneals silicon of the source/drain with the silicidable metal layer to form a metal silicide source/drain contact, anneals polysilicon of the gate with the silicidable metal layer to form a metal silicide gate contact, and anneals the silicon-rich dielectric layer, the oxynitride layer, the polysilicon layer, and the silicidable metal layer to form the metal silicide structure on the side of the isolation structure.

14. The method of claim 9, wherein the silicidable metal layer includes one of titanium, cobalt, tungsten, nickel-platinum, and nickel.

15. The method of claim 9, wherein: the silicon-rich dielectric layer is one of a silicon-rich nitride material, a silicon-rich carbon nitride material, and a silicon-rich oxynitride material having a silicon-to-nitrogen atomic ratio of approximately 1.5 to 10 as measured by an elemental analysis technique.

16. The method of claim 9, wherein the silicon-rich dielectric layer is a silicon-rich oxide material or a silicon-rich oxynitride material having a silicon-to-oxygen atomic ratio of approximately 1.0 to 10 as measured by an elemental analysis technique.

17. The method of claim 9, wherein the silicon-rich dielectric layer is a silicon-rich carbide material or a silicon-rich carbon nitride material having a silicon-to-carbon atomic ratio of approximately 1.5 to 10 as measured by an elemental analysis technique.

\* \* \* \* \*